(12) United States Patent
Nakano et al.

(10) Patent No.: US 9,082,860 B2
(45) Date of Patent: Jul. 14, 2015

(54) SEMICONDUCTOR DEVICE

(75) Inventors: Tadashi Nakano, Atsugi (JP); Mai Sugikawa, Isehara (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 348 days.

(21) Appl. No.: 13/425,448

(22) Filed: Mar. 21, 2012

(65) Prior Publication Data

US 2012/0248433 A1 Oct. 4, 2012

(30) Foreign Application Priority Data

Mar. 31, 2011 (JP) ................... 2011-078111

(51) Int. Cl.
*H01L 29/786* (2006.01)
*H01L 29/49* (2006.01)

(52) U.S. Cl.
CPC ........ *H01L 29/7869* (2013.01); *H01L 29/4908* (2013.01); *H01L 29/78603* (2013.01); *H01L 29/78606* (2013.01)

(58) Field of Classification Search
USPC ......................................................... 257/43
See application file for complete search history.

(56) References Cited

U.S. PATENT DOCUMENTS

| 5,528,032 | A | 6/1996 | Uchiyama |
| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — David Vu
*Assistant Examiner* — Jonathan Han
(74) *Attorney, Agent, or Firm* — Eric J. Robinson; Robinson Intellectual Property Law Office, P.C.

(57) ABSTRACT

A semiconductor device of stable electrical characteristics, whose oxygen vacancies in a metal oxide is reduced, is provided. The semiconductor device includes a gate electrode, a gate insulating film over the gate electrode, a first metal oxide film over the gate insulating film, a source electrode and a drain electrode which are in contact with the first metal oxide film, and a passivation film over the source electrode and the drain electrode. A first insulating film, a second metal oxide film, and a second insulating film are stacked sequentially in the passivation film.

18 Claims, 17 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1* | 5/2006 | Baude et al. | 313/506 |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1* | 12/2008 | Ryu et al. | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025675 A1* | 2/2010 | Yamazaki et al. | 257/43 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163868 A1* | 7/2010 | Yamazaki et al. | 257/43 |
| 2010/0244020 A1* | 9/2010 | Sakata et al. | 257/43 |
| 2011/0233542 A1* | 9/2011 | Yamazaki et al. | 257/43 |
| 2011/0260171 A1 | 10/2011 | Yamazaki | |
| 2011/0284844 A1 | 11/2011 | Endo et al. | |
| 2011/0284845 A1 | 11/2011 | Endo et al. | |
| 2011/0303914 A1 | 12/2011 | Yamazaki | |
| 2012/0161132 A1 | 6/2012 | Yamazaki | |
| 2012/0248433 A1 | 10/2012 | Nakano et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-096055 A | 4/2007 |
| JP | 2007-123861 | 5/2007 |
| JP | 2007-123861 A | 5/2007 |
| JP | 2009-224479 | 10/2009 |
| JP | 2009-224479 A | 10/2009 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

(56) References Cited

OTHER PUBLICATIONS

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digset of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMCLDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, andYb2Fe3O7 Types of Structures for Compounds in the In2O3 and Sc2O3-A2O3-BO Systems [A; Fe, Ga, or Al; B: Mg, Mn, Fe, Ni, Cu, or Zn] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The present invention relates to a semiconductor device using an oxide semiconductor.

In this specification, the semiconductor device refers to any device that can operate utilizing semiconductor characteristics. A transistor described in this specification is the semiconductor device, and an electrooptic device, a semiconductor circuit, and an electronic device each including the transistor are all included in the category of the semiconductor device.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing such a silicon semiconductor is used in integrated circuits (ICs) and the like.

Attention has been drawn to a technique in which, instead of the above silicon semiconductor, a metal oxide exhibiting semiconductor characteristics is used for transistors. In this specification, such a metal oxide exhibiting semiconductor characteristics is also referred to as an oxide semiconductor. For example, a technique is disclosed in which a transistor is manufactured using a Zn—O-based oxide or an In—Ga—Zn—O-based oxide as an oxide semiconductor for application as a switching element or the like in a pixel of a display device (see Patent Documents 1 and 2).

Meanwhile, it has been pointed out that hydrogen behaves as a source of carriers in an oxide semiconductor. Therefore, some measures need to be taken to prevent hydrogen from entering the oxide semiconductor in forming the oxide semiconductor. Further, a shift of a threshold voltage has been suppressed by reducing the amount of hydrogen contained in not only the oxide semiconductor but also a gate insulating film in contact with the oxide semiconductor (see Patent Document 3).

REFERENCE

Patent Document 1: Japanese Published Patent Application No. 2007-123861
Patent Document 2: Japanese Published Patent Application No. 2007-096055
Patent Document 3: Japanese Published Patent Application No. 2009-224479

SUMMARY OF THE INVENTION

Further, not only hydrogen, but also an oxygen vacancy functions as a source of carriers in the metal oxide. Some of the oxygen vacancies in the metal oxide behave as donors to generate electrons that are carriers in the metal oxide. Many oxygen vacancies in a metal oxide including a channel formation region of a transistor lead to generation of electrons in the channel formation region, which shifts the threshold voltage of the transistor in the negative direction.

An insulating film which is in contact with the metal oxide film including the channel formation region also affects the threshold voltage of the transistor. For example, a negative fixed charge such as an oxygen ion of an unbonded oxygen atom contained in the insulating film enables the threshold voltage of the transistor to be shifted in the positive direction. In contrast, if oxygen is eliminated from the insulating film to the outside, the number of negative fixed charges therein is decreased, so that the threshold voltage of the transistor may be shifted in the negative direction.

In view of the above, one object of one embodiment of the present invention is to provide a semiconductor device having excellent and stable electrical characteristics, in which oxygen vacancies in a metal oxide including a channel formation region are reduced and oxygen contained in an insulating film in contact with the metal oxide is prevented from being released to the outside.

To reduce oxygen vacancies in a metal oxide in a transistor, there is a technique of supplying oxygen into the metal oxide. In one embodiment of the present invention, an insulating film from which oxygen is eliminated by heat treatment is provided in contact with a metal oxide film including a channel formation region. Accordingly, oxygen eliminated by heat treatment is supplied to the metal oxide to reduce oxygen vacancies therein.

Such an insulating film from which oxygen is eliminated by heat treatment (also referred to as a first insulating film) cannot supply oxygen sufficiently to the metal oxide in some cases due to out-diffusion of oxygen eliminated at the heat treatment. Against those cases, in one embodiment of the present invention, in addition to a metal oxide film including a channel formation region (also referred to as a first metal oxide film), another metal oxide film (also referred to as a second metal oxide film) is provided in contact with an insulating film from which oxygen is eliminated by heat treatment. Since the second metal oxide film can prevent oxygen from passing therethrough, the second metal oxide film can prevent out-diffusion of oxygen eliminated by the heat treatment. Accordingly, oxygen can be supplied sufficiently to the first metal oxide film, and further, out-diffusion of oxygen contained in the insulating film can be prevented.

There is also a case where oxygen vacancies exist in the second metal oxide film for preventing oxygen from passing therethrough. Against that case, in one embodiment of the present invention, a second metal oxide film is sandwiched between insulating films from which oxygen is eliminated by heat treatment (a first insulating film and a second insulating film), whereby oxygen vacancies in the second metal oxide film can be sufficiently repaired.

One embodiment of the present invention is a semiconductor device including a gate electrode, a gate insulating film over the gate electrode, a first metal oxide film over the gate insulating film, a source electrode and a drain electrode which are in contact with the first metal oxide film, and a passivation film over the source electrode and the drain electrode. A first insulating film, a second metal oxide film, and a second insulating film are stacked sequentially in the passivation film.

One embodiment of the present invention is a semiconductor device including a gate electrode, a gate insulating film over the gate electrode, a first metal oxide film over the gate insulating film, a source electrode and a drain electrode which are in contact with the first metal oxide film, and a passivation film over the source electrode and the drain electrode. A second insulating film, a second metal oxide film, and a first insulating film are stacked sequentially in the gate insulating film.

In each of the above-described structures, the thickness of the first insulating film may be greater than that of the second insulating film.

One embodiment of the present invention is a semiconductor device including a base insulating film, a first metal oxide film over the base insulating film, a source electrode and a drain electrode which are in contact with the first metal oxide film, a gate insulating film over the first metal oxide film, the source electrode, and the drain electrode, and a gate electrode which is provided over the first metal oxide film with the gate insulating film interposed therebetween. A first insulating film, a second metal oxide film, and a second insulating film are stacked sequentially in the base insulating film.

One embodiment of the present invention is a semiconductor device including a base insulating film, a first metal oxide film over the base insulating film, a source electrode and a drain electrode which are in contact with the first metal oxide film, a gate insulating film over the first metal oxide film, the source electrode, and the drain electrode, and a gate electrode which is provided over the first metal oxide film with the gate insulating film interposed therebetween. A second insulating film, a second metal oxide film, and a first insulating film are stacked sequentially in the gate insulating film.

In each of the above-described structures, the thickness of the first insulating film is preferably greater than that of the second insulating film.

In each of the above-described structures, the thickness of the first metal oxide film may be greater than that of the second metal oxide film. As for such a metal oxide film, a thickness as large as 5 nm is required to prevent oxygen from passing therethrough, but too large thickness might lead to an increase of the parasitic capacitance due to its high relative permittivity in the case where the metal oxide film is used except for a metal oxide film including a channel formation region. Therefore, the thickness of the second metal oxide film is preferably greater than or equal to 5 nm and less than or equal to 15 nm.

In each of the above-described structures, insulating films from which oxygen is eliminated by heat treatment are preferably used as the first insulating film and the second insulating film.

In each of the above-described structures, each of the first metal oxide film and the second metal oxide film preferably contains at least two kinds of elements selected from In, Ga, Sn, and Zn. Further, in each of the above-described structures, an element contained in the first metal oxide film may be the same as or different from an element contained in the second metal oxide film. For example, an In—Ga—Zn—O-based material may be used for each of the first metal oxide film and the second metal oxide film; alternatively, an In—Ga—Zn—O-based material may be used for the first metal oxide film, and an In—Ga—Zn—O—N-based material may be used for the second metal oxide film.

Further, the metal oxide film is a conductor, a semiconductor, or an insulator, which depends on the amount of hydrogen or the number of oxygen vacancies. For example, the resistivity of the metal oxide film changes depending on the amount of hydrogen or the number of oxygen vacancies contained in the metal oxide film.

Heat treatment on the structure in which insulating films from which oxygen is not eliminated by heat treatment are provided with the metal oxide film interposed therebetween makes the metal oxide film an electrical conductor. On the other hand, heat treatment on the structure in which insulating films from which oxygen is eliminated by heat treatment are provided with the metal oxide film interposed therebetween makes the metal oxide film an electrical insulator. In light of the resistivity of the metal oxide film, a metal oxide film where the resistivity is less than or equal to 10 $\Omega \cdot cm$ is a conductor whereas a metal oxide film where the resistivity is greater than or equal to $1 \times 10^8$ $\Omega \cdot cm$ is an insulator.

In order that the first metal oxide film is a semiconductor, it is necessary that the resistivity thereof falls within the range over the maximum resistivity of a conductor under the minimum resistivity of an insulator, and thus the first metal oxide film may be formed to have a resistivity greater than 10 $\Omega \cdot cm$ and less than $1 \times 10^8$ $\Omega \cdot cm$.

The first metal oxide film and the second metal oxide film may be amorphous or may have a crystalline state. For example, the first metal oxide film is preferably a non-single-crystal metal oxide including a phase which has triangular, hexagonal, regular triangular, or regular hexagonal atomic arrangement when seen from the direction perpendicular to the a-b plane of the non-single-crystal and in which metal atoms are arranged in a layered manner or metal atoms and oxygen atoms are arranged in a layered manner when seen from the direction perpendicular to the c-axis direction of the same; in this specification, such a metal oxide film is referred to as a CAAC-OS film (c axis aligned crystalline oxide semiconductor film).

The CAAC-OS film used as the first metal oxide film enables a change of electrical characteristics of the transistor due to irradiation with visible light or ultraviolet light or application of heat, bias, or the like to be suppressed, leading to an improvement of the reliability of the semiconductor device.

According to one embodiment of the present invention, a semiconductor device having excellent and stable electrical characteristics can be provided, in which oxygen vacancies in a metal oxide are reduced and out-diffusion of oxygen contained in an insulating film in contact with the metal oxide is prevented.

DETAILED DESCRIPTION OF THE INVENTION

Figure 1A:
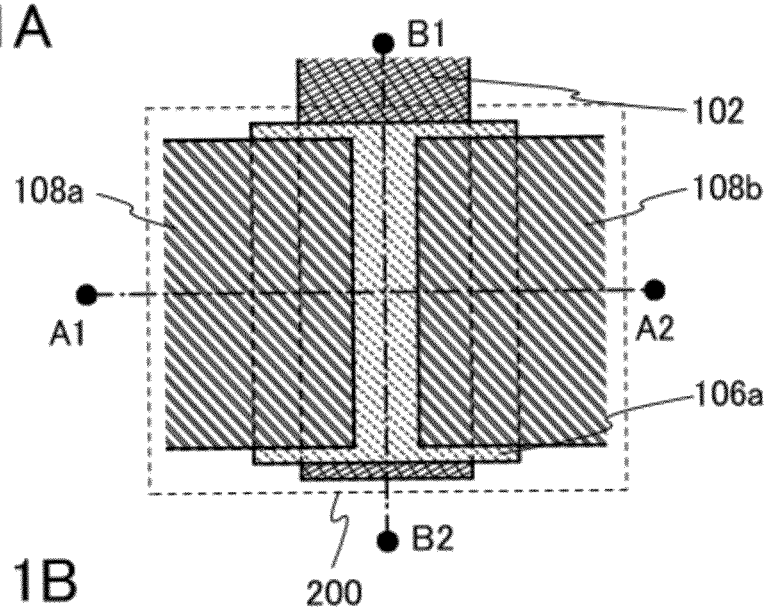
FIGS. 1A to 1C are a top view and cross-sectional views illustrating an example of a semiconductor device according to one embodiment of the present invention.

Embodiments of the present invention will be described below with reference to the accompanying drawings. However, the present invention is not limited to the description below, and those skilled in the art will appreciate that a variety of modifications can be made on the modes and details without departing from the spirit and scope of the present invention. Therefore, the present invention should not be construed as being limited to the description in the following embodiments. Note that the same portions or portions having similar functions in the structure of the present invention described below are denoted by the same reference numerals throughout the drawings, and as such description thereof is not repeated.

In each drawing in this specification, the size, the film thickness, or the region of each component is exaggerated for clarity in some cases. Therefore, embodiments of the present invention are not limited to such scales.

Further, ordinals such as "first", "second", and "third" in this specification and the like are used to avoid confusion among components, and do not limit the components numerically. Therefore, for example, the ordinal "first" can be replaced with any other ordinal such as "second" or "third" as appropriate.

Still further, respective functions of "source" and "drain" may be switched upon a change of the direction of a current flow in a circuit operation, for example. Therefore, the terms "source" and "drain" can be switched each other in this specification and the like.

(Embodiment 1)

In this embodiment, a semiconductor device according to one embodiment of the present invention and a manufacturing method thereof are described with reference to FIGS. 1A to 1C, FIGS. 2A to 2C, and FIGS. 3A to 3E.

<Example of Structure of Semiconductor Device>

Figure 1B:
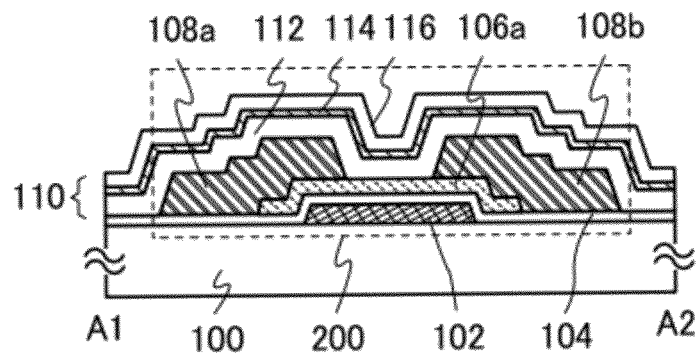
Figure 1C:
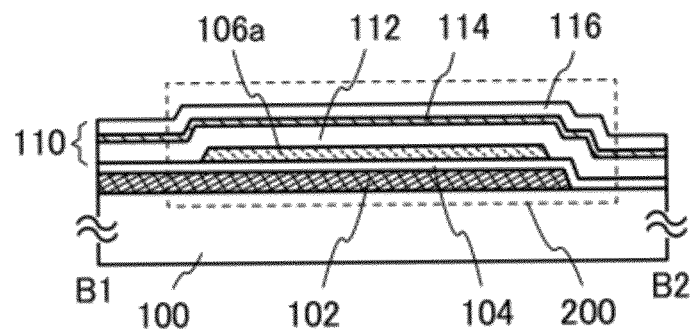

FIGS. 1A to 1C are a plan view and cross-sectional views of a transistor 200 as an example of a semiconductor device according to one embodiment of the present invention. FIG. 1A is a plan view, FIG. 1B is a cross-sectional view along A1-A2 of FIG. 1A, and FIG. 1C is a cross-sectional view along B1-B2 of FIG. 1A. In FIG. 1A, to avoid complexity, part of components of the transistor 200 (e.g., a gate insulating film 104) is omitted.

The transistor 200 shown in FIGS. 1A to 1C includes over a substrate 100, a gate electrode 102, a gate insulating film 104 over the gate electrode 102, a metal oxide film 106a over the gate insulating film 104, and a source and drain electrodes 108a and 108b which are in contact with the metal oxide film 106a. The metal oxide film 106a is also referred to as an oxide semiconductor, coming from its semiconductor characteristics.

The transistor 200 shown in FIGS. 1A to 1C is a bottom-gate transistor, and has a top-contact structure in which the source and drain electrodes 108a and 108b are in contact with a top surface of the metal oxide film 106a. Alternatively, a bottom-contact structure in which the source and drain electrodes 108a and 108b are in contact with a bottom surface of the metal oxide film 106a may be employed.

A region of the metal oxide film 106a which overlaps with the gate electrode 102 functions as a channel formation region.

The metal oxide film 106a is a metal oxide containing at least two elements selected from In, Ga, Sn, and Zn. The metal oxide may have a bandgap greater than or equal to 2 eV and less than 6 eV, preferably greater than or equal to 2.5 eV and less than or equal to 5.5 eV, further preferably greater than or equal to 3 eV and less than or equal to 5 eV. Such a metal oxide having a wide bandgap enables the off-state current of the transistor 200 to be low.

Further, a passivation film 110 is provided over the metal oxide film 106a and the source and drain electrodes 108a and 108b so as to be in contact with the metal oxide film 106a. In the transistor 200 shown in FIGS. 1A to 1C, the passivation film 110 includes an insulating film 112, a metal oxide film 114, and an insulating film 116. In this embodiment, insulating films from which oxygen is eliminated by heat treatment are used for the insulating films 112 and 116.

In this specification and the like, "oxygen is eliminated by heat treatment" means that the amount of eliminated oxygen (or released oxygen) which is converted into oxygen atoms is greater than or equal to $1.0 \times 10^{18}$ atoms/cm$^3$, preferably greater than or equal to $3.0 \times 10^{20}$ atoms/cm$^3$ according to thermal desorption spectroscopy (TDS). In contrast, "oxygen is not eliminated by heat treatment" means that the amount of eliminated oxygen (or released oxygen) which is converted into oxygen atoms is less than $1.0 \times 10^{18}$ atoms/cm$^3$ according to TDS.

A method for quantifying the amount of released oxygen by conversion into oxygen atoms with TDS analysis is described below.

The elimination amount of gas in the TDS analysis is proportional to the integral value of its ion intensity. Thus, the elimination amount of gas can be calculated from the ratio of the measured ion intensity to the reference value of a standard sample. The reference value of a standard sample refers to the ratio of the predetermined density of atoms contained in the sample to the integral value of an ion intensity corresponding to the atoms.

For example, the number of eliminated oxygen molecules ($N_{O2}$) from the insulating film can be obtained according to Formula 1 with the TDS analysis results of a silicon wafer containing hydrogen at a predetermined density, which is a standard sample, and the TDS analysis results of the insulating film. Here, all gases having a mass number of 32 according to the TDS analysis are assumed to stem from an oxygen molecule, without consideration of CH$_3$OH that has the mass number of 32 but is less likely to exist in nature. An oxygen molecule containing an oxygen atom having a mass number of 17 or 18 which is an isotope of an oxygen atom is not taken into consideration either because the proportion of such a molecule in natural is minimal.

$$N_{O2} = N_{H2}/S_{H2} \times S_{O2} \times \alpha \quad \text{(Formula 1)}$$

In the formula, $N_{H2}$ is the value obtained by converting the number of hydrogen molecules eliminated from the standard sample into densities, and $S_{H2}$ is the integral value of an ion intensity of the standard sample according to the TDS analysis. Thus, the reference value of the standard sample is expressed by $N_{H2}/S_{H2}$. Further, $S_{O2}$ is the integral value of an ion intensity of the insulating film according to the TDS analysis, and α is a coefficient affecting the ion intensity in the TDS analysis. For more details of Formula 1, Japanese Published Patent Application No. H6-275697 can be referred to. Note that the above-mentioned value of the amount of eliminated oxygen was obtained with a thermal desorption spectroscopy apparatus produced by ESCO Ltd., EMD-WA1000S/W and with a silicon wafer containing hydrogen atoms at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of oxygen molecules. Since the above-described a includes the ionization rate of oxygen molecules, the number of eliminated oxygen atoms can also be estimated through the evaluation of the number of eliminated oxygen molecules.

As described above, $N_{O2}$ is the number of eliminated oxygen molecules. As for the insulating film, the amount of eliminated oxygen which is converted into oxygen atoms is twice the number of eliminated oxygen molecules.

An example of a film from which oxygen is eliminated by heat treatment is a film of silicon oxide containing excess oxygen ($SiO_X$ (X>2)). In the oxygen-excess silicon oxide ($SiO_X$ (X>2)), the number of oxygen atoms per unit volume is greater than twice the number of silicon atoms per unit volume. The number of silicon atoms and the number of oxygen atoms per unit volume are according to those measured by Rutherford backscattering spectrometry.

The metal oxide film 106a is provided between the gate insulating film 104 and the insulating film 112. An insulating film from which oxygen is eliminated by heat treatment is used as the insulating film 112, whereas an insulating film from which oxygen is not eliminated by heat treatment is used as the gate insulating film 104. By heat treatment, oxygen is eliminated from the insulating film 112 to be supplied to the metal oxide film 106a.

Further, many negative fixed charges such as an oxygen ion of an unbonded oxygen atom are contained in the insulating film from which oxygen is eliminated by heat treatment. Thus, the insulating film from which oxygen is eliminated by heat treatment, which is provided in contact with the metal oxide film including a channel formation region, enables the threshold voltage of the transistor to be shifted in the positive direction, which is preferable.

However, out-diffusion of eliminated oxygen also occurs from the insulating film at the time of the heat treatment, so that oxygen is not sufficiently supplied to the metal oxide film 106a in some cases. Further, the out-diffusion of oxygen leads to a reduction in the number of negative fixed charges in the insulating film. In accordance with the reduction in the number of negative fixed charges, the threshold voltage of the transistor may be shifted in the negative direction.

In view of that case, the metal oxide film 114 which is other than the metal oxide film 106a is provided on and in contact with the insulating film 112 in one embodiment of the present invention. Since the metal oxide film can prevent oxygen from passing therethrough, out-diffusion of oxygen eliminated from the insulating film 112 at the time of the heat treatment can be prevented.

Further, oxygen vacancies may exist in the metal oxide film 114. In view of that case, the metal oxide film 114 is sandwiched by the insulating films from which oxygen is eliminated by heat treatment (the insulating films 112 and 116) in one embodiment of the present invention.

The metal oxide film can prevent oxygen from passing therethrough even with a thickness as ultrathin as 5 nm. In addition, too large thickness over 15 nm of the metal oxide film might lead to an increase of the parasitic capacitance due to its high relative permittivity (e.g., 15) in the case where the metal oxide film is used except for a metal oxide film including a channel formation region. Therefore, the thickness of the metal oxide film 114 is preferably greater than or equal to 5 nm and less than or equal to 15 nm. By suppressing the metal oxide film 114 to be ultrathin as described above, a remarkable increase of parasitic capacitance can be prevented even as compared to the case without the metal oxide film 114 in the passivation film.

Since the metal oxide film 114 for preventing out-diffusion of oxygen is sandwiched by the insulating films 112 and 116 from which oxygen is eliminated by heat treatment, oxygen is eliminated from the insulating films 112 and 116 by heat treatment to be supplied to the metal oxide film 114 to repair oxygen vacancies therein, whereby the metal oxide film 114 is turned into an insulator (shows insulating characteristics). Accordingly, the metal oxide film 114, which is used as part of the passivation film 110, does not affect the electrical characteristics of the transistor 200.

To improve the efficiency of supply of oxygen to the metal oxide film 106a, it is preferable that the thickness of the insulating film 112 in contact with the metal oxide film 106a be greater than that of the insulating film 116 in contact with the metal oxide film 114. Respective thicknesses of the insulating films 112 and 116 can be set as appropriate in accordance with the thickness of the passivation film 110.

With the film from which oxygen is eliminated by heat treatment provided as the insulating film 112, oxygen is supplied from the insulating film 112 to the metal oxide film 106a, whereby interface states between the insulating film 112 and the metal oxide film 106a can be reduced. Accordingly, electric charge or the like that can be generated owing to operation of the transistor 200 can be prevented from being trapped at the interface between the insulating film 112 and the metal oxide film 106a, which can make the transistor 200 a transistor with less deterioration of electrical characteristics.

Further, with the metal oxide film 114 provided in contact with the insulating film 112, out-diffusion of oxygen can be prevented, so that oxygen vacancies in the metal oxide film 106a including a channel formation region can be sufficiently repaired. Accordingly, a shift in the negative direction of the threshold voltage of the transistor can be suppressed. In addition, negative fixed charges in the insulating film 112 can be prevented from being reduced; accordingly, a shift in the negative direction of the threshold voltage of the transistor due to a reduction in the number of negative fixed charges can be suppressed.

The hydrogen concentration of the metal oxide film 106a, 114 is less than or equal to $1 \times 10^{20}$ atoms/cm$^3$, preferably less than or equal to $1 \times 10^{19}$ atoms/cm$^3$, further preferably less than or equal to $1 \times 10^{18}$ atoms/cm$^3$. Since the hydrogen concentration is low in the channel formation region in the metal oxide film 106a, a change in threshold voltage by light irradiation or BT (bias thermal) stress test is suppressed, leading to a highly reliable transistor whose electrical characteristics are stable. As for the metal oxide film 114 which is used not as a semiconductor but as an insulator, it is preferable that the hydrogen concentration be as low as possible.

The metal oxide film 114 is a metal oxide containing at least two elements selected from In, Ga, Sn, and Zn, like the metal oxide film 106a. An element contained in the metal oxide film 114 may be the same as or different from an element contained in the metal oxide film 106a. For example, an In—Ga—Zn—O-based material may be used for each of the metal oxide film 106a and the metal oxide film 114; alternatively, an In—Ga—Zn—O-based material may be used for the metal oxide film 106a, and an In—Ga—Zn—O—N-based material may be used for the metal oxide film 114.

<Application Example of Semiconductor Device>

Figure 2A:
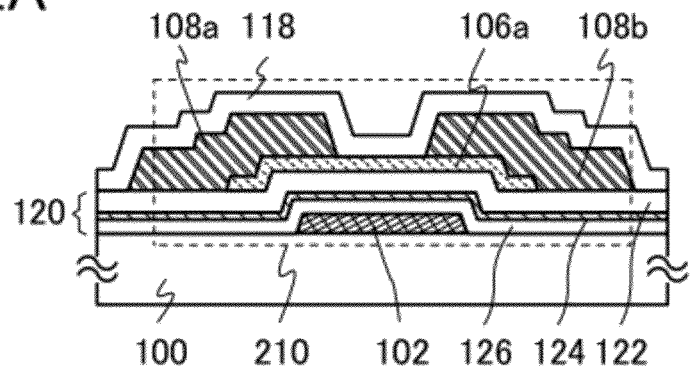
FIGS. 2A to 2C are views illustrating semiconductor devices according to embodiments of the present invention.
Figure 2B:
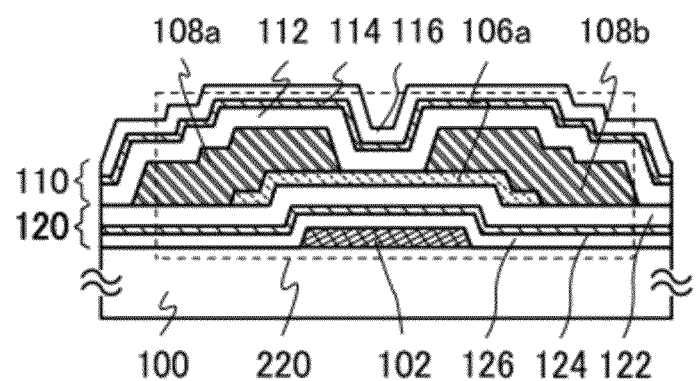
Figure 2C:
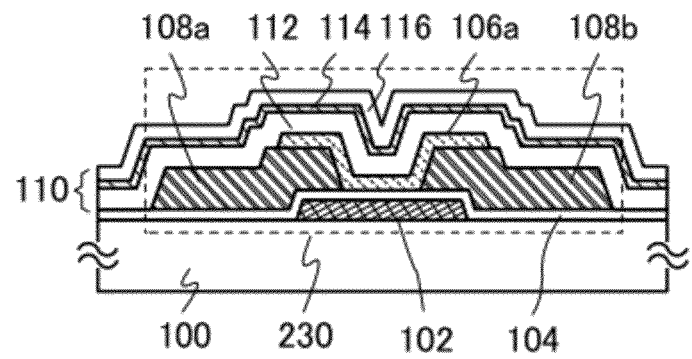

FIGS. 2A to 2C illustrate cross-sectional structures of transistors having different structures from the transistor 200.

A transistor 210 shown in FIG. 2A includes over a substrate 100, a gate electrode 102, a gate insulating film 120 over the gate electrode 102, a metal oxide film 106a over the gate insulating film 120, and a source and drain electrodes 108a and 108b which are in contact with the metal oxide film 106a.

The transistor 210 is different from the transistor 200 in that a metal oxide film for preventing out-diffusion of oxygen is provided in the gate insulating film 120. That is, the gate insulating film 120 has a three-layer structure including an insulating film 122, a metal oxide film 124, and an insulating film 126. Further, an insulating film 118 is provided as a passivation film over the metal oxide film 106a and the source and drain electrodes 108a and 108b. In this embodiment, insulating films from which oxygen is eliminated by heat treatment are used for the insulating films 122 and 126, and an insulating film from which oxygen is not eliminated by heat treatment is used as the insulating film 118.

To improve the efficiency of supply of oxygen to the metal oxide film 106a, it is preferable that the thickness of the insulating film 122 in contact with the metal oxide film 106a be greater than that of the insulating film 126 in contact with the metal oxide film 124. Respective thicknesses of the insulating films 122 and 126 can be set in accordance with the thickness of the gate insulating film 120. Further, the metal oxide film 124 can prevent oxygen from passing therethrough with a thickness equal to or greater than 5 nm, and the thickness of the metal oxide film 124 can be set in accordance with the thickness of the gate insulating film 120.

A transistor 220 shown in FIG. 2B includes over a substrate 100, a gate electrode 102, a gate insulating film 120 over the gate electrode 102, a metal oxide film 106a over the gate insulating film 120, and a source and drain electrodes 108a and 108b which are in contact with the metal oxide film 106a. Further, a passivation film 110 is provided over the metal oxide film 106a and the source and drain electrodes 108a and 108b.

For the gate insulating film 120 and the passivation film 110 of the transistor 220, the description of the transistor 200 and the transistor 210 can be referred to, and thus detailed description thereof is skipped.

The transistor 200, 210, 220 described hereinabove has a top-contact structure in which the source and drain electrodes 108a and 108b are in contact with a top surface of the metal oxide film 106a. Alternatively, a bottom-contact structure in which the source and drain electrodes 108a and 108b are in contact with a bottom surface of the metal oxide film 106a may be employed in a transistor in one embodiment of the present invention. An example of such a bottom-contact structure is illustrated in FIG. 2C.

A transistor 230 shown in FIG. 2C includes over a substrate 100, a gate electrode 102, a gate insulating film 104 over the gate electrode 102, a source and drain electrodes 108a and 108b over the gate insulating film 104, and a metal oxide film 106a in contact with the source and drain electrodes 108a and 108b. Further, a passivation film 110 is provided over the metal oxide film 106a, like the transistor 200.

Since the passivation film 110 is provided to cover a whole of the metal oxide film 106a, oxygen can be efficiently supplied to the metal oxide film 106a.

Also in the bottom-contact transistor, a metal oxide film for preventing out-diffusion of oxygen may be provided in the gate insulating film or in each of the gate insulating film and the passivation film.

As described above, in one embodiment of the present invention, an insulating film (first insulating film) from which oxygen is eliminated by heat treatment is provided in contact with a metal oxide film (first metal oxide film) including a channel formation region in order to reduce oxygen vacancies in the first metal oxide film. Further, a metal oxide film (second metal oxide film) which is other than the first metal oxide film is provided in contact with the first metal oxide film. The second metal oxide film is provided between the insulating film (first insulating film) from which oxygen is eliminated by heat treatment and an insulating film (second insulating film) from which oxygen is eliminated by heat treatment.

The insulating film 112 (or the insulating film 122) from which oxygen is eliminated by heat treatment is sandwiched by the metal oxide film 106a and the metal oxide film 114 (or the metal oxide film 124), whereby out-diffusion of oxygen eliminated from the insulating film 112 (or the insulating film 122) by heat treatment can be prevented, so that oxygen vacancies in the metal oxide film 106a can be sufficiently repaired. In addition, negative fixed charges contained in the insulating film 112 (or the insulating film 122) can be prevented from decreasing. That is, according to one embodiment of the present invention, oxygen vacancies in the metal oxide film 106a are reduced, and oxygen contained in the insulating film 112 (or the insulating film 122) in contact with the metal oxide film 106a is prevented from being released to the outside, whereby a semiconductor device having excellent and stable electrical characteristics can be provided.

<Manufacturing Method of Semiconductor Device>

Next, as an example of a manufacturing method of a semiconductor device of one embodiment of the present invention, a method for manufacturing the transistor 200 is described with reference to FIGS. 3A to 3E.

First, a conductive film which can be used as a gate electrode is formed over the substrate 100, and then by a photolithography process, a resist mask is formed over the conductive film and the conductive film is etched into an appropriate shape with the use of the resist mask, so that the gate electrode 102 is formed. Then, the gate insulating film 104 is formed over the gate electrode 102 (see FIG. 3A).

Any substrate having an insulating surface can be used as the substrate 100. For example, a glass substrate, a ceramic substrate, a quartz substrate, or a sapphire substrate can be used. A single crystal semiconductor substrate or a polycrystalline semiconductor substrate of silicon, carbon silicon, or the like; a compound semiconductor substrate of silicon germanium or the like; an SOI substrate; or the like can be used as the substrate 100 as long as the substrate has an insulating surface, and such a substrate provided with a semiconductor element can be used as well. Although there is no particular limitation on a substrate that can be used as the substrate 100, it is necessary that the substrate have heat resistance to withstand heat treatment performed later. In this embodiment, a glass substrate is used as the substrate 100.

A flexible substrate can also be used as the substrate 100. In the case of using a flexible substrate, a transistor may be directly formed over the flexible substrate, or alternatively, the transistor 200 may be formed over another substrate and then separated from the substrate and transferred to the flexible substrate. To separate from another substrate and transfer to the flexible substrate, a separation layer and an insulating film may be provided over another substrate and the transistor 200 may be formed thereover.

Any of single metals such as aluminum, titanium, chromium, nickel, copper, yttrium, zirconium, molybdenum, silver, tantalum, and tungsten, or an alloy containing any of the metals as its main component can be used as a conductive material for the gate electrode 102. The gate electrode 102 can be formed of a conductive film having a single-layer structure or a stacked-layer structure using the above-described conductive material. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, or a three-layer structure in which a titanium film, an aluminum film, and a titanium film are stacked in this order can be employed. Further, a transparent conductive material such as indium oxide or indium oxide including tin oxide, or zinc oxide may be used.

The conductive film which can be used as the gate electrode 102 is formed by a sputtering method, a plasma enhanced CVD method, or the like to a thickness greater than or equal to 50 nm and less than or equal to 300 nm. Then, by a photolithography process, a resist mask is formed over the conductive film and the conductive film is etched into an appropriate shape with the use of the resist mask, so that the gate electrode 102 is formed. The resist mask can be formed by an ink-jet method, a printing method, or the like as appropriate, instead of the photolithography process. The etching can be performed by a dry etching, a wet etching, or a combination of dry etching and wet etching. In this embodiment, tungsten is stacked to a thickness of 150 nm by a sputtering method as the conductive film.

As the gate insulating film 104, an insulating film(s) selected from an oxide insulating film such as a silicon oxide film, a gallium oxide film, or an aluminum oxide film; a nitride insulating film such as a silicon nitride film or an aluminum nitride film; a silicon oxynitride film; an aluminum oxynitride film; and a silicon nitride oxide film can be used. A high-k material such as hafnium oxide, yttrium oxide, hafnium silicate ($HfSi_xO_y$ (x>0, y>0)), hafnium silicate to which nitrogen is added ($HfSiO_xN_y$ (x>0, y>0)), or hafnium aluminate ($HfAl_xO_y$ (x>0, y>0)) can also be used as well as the above-described materials. The gate insulating film 104 may have a single-layer structure of the high-k material or a stacked-layer structure of the high-k material and the insulating film of the above-described material.

The gate insulating film 104 is formed by a sputtering method, a plasma enhanced CVD method, or the like to a thickness greater than or equal to 5 nm and less than or equal to 300 nm. With the high-k material, the gate insulating film 104 can be formed thick physically without changing the electrical thickness (for example, the equivalent silicon oxide thickness) of the gate insulating film, whereby the gate leakage current can be reduced.

In this embodiment, a silicon oxynitride film is formed as the gate insulating film 104 by a plasma enhanced CVD method. A silicon oxide film formed by a plasma enhanced CVD method is a film from which oxygen is not eliminated by heat treatment.

Figure 3A:
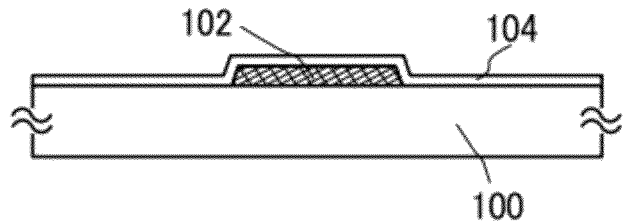
FIGS. 3A to 3E are views illustrating a manufacturing method of a semiconductor device, according to one embodiment of the present invention.
Figure 3B:
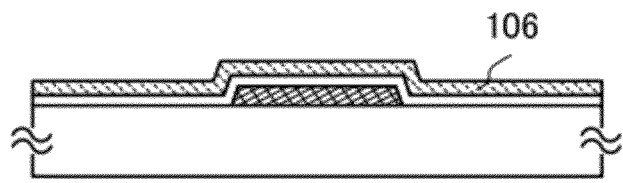

Next, a metal oxide film 106 is formed over the gate insulating film 104 (see FIG. 3B).

As a material of the metal oxide film 106, a metal oxide material containing two or more selected from In, Ga, Zn, and Sn can be used. For example, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. Here, for example, the In—Ga—Zn—O-based material means oxide containing indium (In), gallium (Ga), and zinc (Zn), and there is no particular limitation on the composition ratio. Further, the In—Ga—Zn—O-based oxide material may contain another element in addition to In, Ga, and Zn. It is preferable that the amount of oxygen be in excess of stoichiometric proportion in the metal oxide film, by which generation of carriers which results from oxygen vacancies in the metal oxide film can be suppressed.

In the case where an In—Ga—Zn—O-based material is used as a material of the metal oxide film 106, one example of a target has a composition ratio of $In_2O_3$:$Ga_2O_3$:ZnO=1:1:1 (molar ratio). Alternatively, a target having a composition ratio of $In_2O_3$:$Ga_2O_3$:ZnO=1:1:2 (molar ratio), a target having a composition ratio of $In_2O_3$:$Ga_2O_3$:ZnO=1:1:4 (molar ratio), or a target having a composition ratio of $In_2O_3$:$Ga_2O_3$:ZnO=2:1:8 (molar ratio) can be used.

In the case where an In—Zn—O-based material is used as a material of the metal oxide film 106, the atomic ratio is set so that In/Zn is greater than or equal to 0.5 and less than or equal to 50, preferably greater than or equal to 1 and less than or equal to 20, further preferably greater than or equal to 3/2 and less than or equal to 30/2. The above range of the atomic ratio of In to Zn leads to an improvement in the field-effect mobility of the transistor 200. Here, where the atomic ratio of the compound is In:Zn:O=X:Y:Z, the relation of Z>1.5X+Y is preferably satisfied.

A material represented by 1 n$MO_3(ZnO)_m$ (m>0) may be used for the metal oxide film 106. In the formula, M represents one or more metal elements selected from Ga, Al, Mn, and Co. For example, M may be Ga, Ga and Al, Ga and Mn, Ga and Co, or the like.

The metal oxide film 106 can be formed by a sputtering method, a molecular beam epitaxy method, an atomic layer deposition method, a pulsed laser deposition method, or the like. The thickness of the metal oxide film 106 is greater than or equal to 5 nm and less than or equal to 100 nm, preferably greater than or equal to 10 nm and less than or equal to 30 nm. The as-deposited metal oxide film is a semiconductor.

The metal oxide film 106 may be amorphous or may have crystallinity. For example, the metal oxide film 106 is a non-single-crystal, specifically, a metal oxide having a phase in which atoms are arranged in a triangle, a hexagon, a regular triangle, or a regular hexagon when seen from the direction perpendicular to the a-b plane of the non-single-crystal and in which metal atoms or metal atoms and oxygen atoms are arranged in layers when seen from the direction perpendicular to the c-axis. In this specification, such a metal oxide film is referred to as a CAAC-OS film. The use of the CAAC-OS film as the film including a channel formation region of the transistor 200 enables a change of electrical characteristics of the transistor 200 due to irradiation with visible light or ultraviolet light, or application of heat, bias, or the like to be suppressed, improving the reliability of the semiconductor device.

As a method for forming the CAAC-OS film as the metal oxide film 106, for example, there are the following two methods. One is a method in which the metal oxide film 106 is deposited while heating the substrate; the other is a method in which film deposition is performed twice and after each film deposition, heat treatment is performed thereon.

In the method in which the metal oxide film 106 is deposited while heating the substrate, the substrate temperature is, for example, higher than or equal to 150° C. and lower than or equal to 450° C., preferably higher than or equal to 250° C. and lower than or equal to 350° C. A CAAC-OS film in which the rate of the crystal portion with respect to the amorphous portion is high can be deposited where the temperature of the substrate 100 heated during the deposition of the metal oxide film 106 is high.

On the other hand, in the method in which film deposition is performed twice, a first-layer metal oxide film is formed over the gate insulating film 104 while keeping the temperature of the substrate 100 at a temperature(s) higher than or equal to 100° C. and lower than or equal to 450° C., and then heat treatment is performed thereon at a temperature(s) higher than or equal to 550° C. and lower than the strain point of the substrate under an atmosphere of nitrogen, oxygen, a rare gas, or dry air. By the heat treatment, a crystalline region (including a plate-like crystal) is formed in a region including a top surface of the first-layer metal oxide film. Then, a second-layer metal oxide film is formed thicker than the first-layer metal oxide film. After that, heat treatment is performed at a temperature(s) higher than or equal to 550° C. and lower than the strain point of the substrate, whereby the crystal growth proceeds upward using the first-layer metal oxide film including the crystalline region (including the plate-like crystal) in the region including the top surface as a seed of crystal growth; thus, the entire second-layer metal oxide film is crystallized. The thickness of the first-layer metal oxide film is preferably greater than or equal to 1 nm and less than or equal to 10 nm.

In the case where the metal oxide film 106 is deposited by a sputtering method, it is preferable that hydrogen enter the metal oxide film 106 as less as possible. To prevent hydrogen from entering, a highly purified rare gas (typically, argon), highly purified oxygen, or a highly purified mixed gas of oxygen and a rare gas, from which an impurity such as a compound or a hydride containing hydrogen, water, or a hydroxyl group has been removed, is used as appropriate as an atmosphere gas supplied into a process chamber of the sputtering apparatus. Further, for exhaust of the process chamber, a cryopump having high capability of exhausting water and a sputtering ion pump having high capability of exhausting hydrogen may be used in combination.

In the above-described manner, the metal oxide film 106 can be deposited with less entrance of hydrogen. The metal oxide film 106 contains some nitrogen even when the sputtering apparatus is used. For example, the nitrogen concentration of the metal oxide film 106 measured by secondary ion mass spectrometry (SIMS) is less than $5 \times 10^{18}$ atoms/cm$^3$.

Electrical charges are generated in some cases due to oxygen vacancies in the metal oxide film 106 during or after the deposition of the metal oxide film 106. In general, part of oxygen vacancies in a metal oxide film becomes a donor to generate an electron as a carrier. That is, also in the transistor 200, part of oxygen vacancies in the metal oxide film 106 becomes a donor to generate an electron as a carrier, which shifts the threshold voltage of the transistor 200 in the negative direction. In addition, the generation of an electron in the metal oxide film 106 is more likely to occur in oxygen vacancies in the vicinity of the interface between the metal oxide film 106 and the gate insulating film 104.

Hence, a first heat treatment is performed thereon after the deposition of the metal oxide film 106.

The first heat treatment is performed to discharge hydrogen (compound including water or a hydroxyl group) from the metal oxide film. That is, hydrogen, which is an unstable carrier source, is eliminated from the metal oxide film 106 by the first heat treatment, whereby a shift of the threshold voltage of the transistor 200 in the negative direction is suppressed. Further, the reliability of the transistor 200 can be improved.

The first heat treatment is performed at a temperature(s) higher than or equal to 150° C. and lower than the strain point of the substrate, preferably higher than or equal to 250° C. and lower than or equal to 450° C., further preferably higher than or equal to 300° C. and lower than or equal to 450° C., in an oxidation atmosphere or an inert atmosphere. The oxidation atmosphere refers to an atmosphere including an oxidation gas such as oxygen, ozone, or nitrogen oxide at a concentration of 10 ppm or more. The inert atmosphere refers to an atmosphere including the oxidation gas at a concentration of less than 10 ppm and is filled with nitrogen or a rare gas. The process time of the heat treatment is 3 minutes to 24 hours. Heat treatment for a time longer than 24 hours is not preferable because the productivity is reduced.

There is no particular limitation on a heat treatment apparatus used for the first heat treatment, and the apparatus may be equipped with a device for heating an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for performing heat treatment using a high-temperature gas.

Figure 3C:
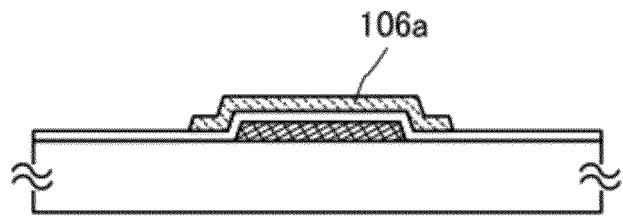

Next, a resist mask is formed over the metal oxide film 106 by a photolithography process, and the metal oxide film 106 is etched with the resist mask into a desired shape, so that the island-shaped metal oxide film 106a is formed (see FIG. 3C). The resist mask can be formed by an ink-jet method, a printing method, or the like as appropriate, as well as the photolithography process. It is preferable to etch the metal oxide film 106 so that an end portion of the metal oxide film 106a is tapered, by which the coverage with any film formed in the following manufacturing process of the transistor 200 can be improved to prevent the film from being cut by a step. The end portion of the metal oxide film 106a can be tapered by etching while the resist mask is made to recede.

The etching step may be performed by dry etching, wet etching, or combination thereof. As an etchant used for the wet etching, a mixed solution of phosphoric acid, acetic acid, and nitric acid, an ammonia hydrogen peroxide mixture (hydrogen peroxide water at 31 wt %: ammonia water at 28 wt %: water=5:2:2 (volume ratio)), or the like can be used. Alternatively, ITO-07N (produced by KANTO CHEMICAL CO., INC.) may be used.

As an etching gas for the dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching, a parallel-plate reactive ion etching (RIE) method, an inductively coupled plasma (ICP) etching method, or the like can be used. In order to process the film into a desired shape, the etching condition (the amount of electric power applied to a coil-shaped electrode, the amount of electric power applied to an electrode on a substrate side, the temperature of the electrode on the substrate side, or the like) is adjusted as appropriate.

Figure 3D:
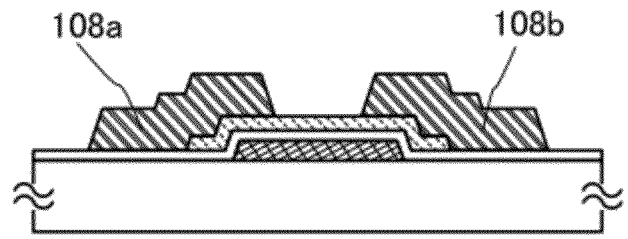

Next, a conductive film which can be used for a source electrode and a drain electrode is deposited over the metal oxide film 106a, a resist mask is formed over the conductive film by a photolithography process, and the conductive film is etched with the resist mask into a desired shape, so that the source and drain electrodes 108a and 108b are formed (see FIG. 3D). The similar conductive material as the conductive material for the gate electrode 102 can be used for the source and drain electrodes 108a and 108b.

In this embodiment, the source and drain electrodes 108a and 108b are formed as follows: a 50-nm-thick titanium film, a 100-nm-thick aluminum film, and a 50-nm-thick titanium film are formed by a sputtering method, and then subjected to a photolithography process and an etching process.

Figure 3E:
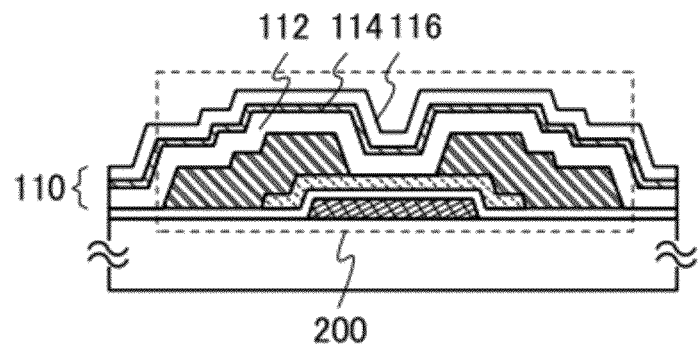

Next, the passivation film 110 is formed over the metal oxide film 106a and the source and drain electrodes 108a and 108b (see FIG. 3E). In this embodiment, the insulating film 112, the metal oxide film 114, and the insulating film 116 are formed in this order to form the passivation film 110.

Insulating films selected from a silicon oxide film, a gallium oxide film, an aluminum oxide film, a silicon oxynitride film, an aluminum oxynitride film, and the like can be used as the insulating films 112 and 116. Any of the insulating films 112 and 116 can be formed by a method similar to that of the gate insulating film 104.

The metal oxide film 114 can be formed using a material and a method which are similar to those of the metal oxide film 106, and as such detailed description thereof is skipped.

The thickness of the passivation film 110 may be greater than or equal to 50 nm and less than or equal to 1000 nm, preferably greater than or equal to 100 nm and less than or equal to 300 nm.

In this embodiment, a 200-nm-thick silicon oxide film is deposited as the insulating film 112 by a sputtering method, a 5-nm-thick In—Ga—Zn—O-based metal oxide film is deposited as the metal oxide film 114 by a sputtering method, and a 50-nm-thick silicon oxide film is deposited as the insulating film 116 by a sputtering method.

In the case where the insulating film 112 and the insulating film 116 are deposited by a sputtering method, it is preferable that hydrogen enters the insulating film 112 and the insulating film 116 as less as possible. To prevent hydrogen from entering, a highly purified rare gas (typically, argon), highly purified oxygen, or a highly purified mixed gas of oxygen and a rare gas, from which an impurity such as a compound containing hydrogen, water, or a hydroxyl group has been removed, is used as appropriate as an atmosphere gas supplied into a process chamber of the sputtering apparatus. Further, for exhaust of the process chamber, a cryopump having high capability of exhausting water and a sputtering ion pump having high capability of exhausting hydrogen may be used in combination.

With the first heat treatment, oxygen might be eliminated from a top surface of the metal oxide film 106a, in addition to a release of hydrogen from the metal oxide film 106a. Accordingly, oxygen vacancies may be generated in the metal oxide film 106a. To repair such generated oxygen vacancies, a second heat treatment is preferably performed after the deposition of the passivation film 110.

The condition and apparatus of the first heat treatment may be applied to the second heat treatment appropriately, and as such detailed description thereof is skipped.

With the second heat treatment, oxygen is eliminated from the insulating film 112 to be supplied to the metal oxide film 106a. Since the metal oxide film 114 for preventing out-diffusion of oxygen is provided over the insulating film 112, out-diffusion of oxygen contained in the insulating film 112 at the time of the second heat treatment can be prevented, whereby oxygen can be supplied effectively to the metal oxide film 106a. The insulating films 112 and 116 supply oxygen also to the metal oxide film 114, so that oxygen vacancies in the metal oxide film 114 can be repaired, whereby the resistance of the metal oxide film 114 is increased; thus, the metal oxide film 114 is turned into an insulator (shows insulating characteristics). Accordingly, the metal oxide film 114, which is used in the passivation film 110 in this embodiment, does not affect electrical characteristics of the transistor 200.

With the first heat treatment and the second heat treatment, the metal oxide films 106a and 114 are highly purified by reducing the hydrogen concentration therein. The hydrogen concentration of any of the metal oxide film 106a and the metal oxide film 114 is less than or equal to $1\times10^{20}$ atoms/cm$^3$, preferably less than or equal to $1\times10^{19}$ atoms/cm$^3$, further preferably less than or equal to $1\times10^{18}$ atoms/cm$^3$. As for the metal oxide film 114 which is used not as a semiconductor but as an insulator, it is preferable that the hydrogen concentration be as low as possible. The hydrogen concentrations of the metal oxide film 106a and the metal oxide film 114 are measured by SIMS.

The metal oxide film 106a which is highly purified by sufficiently reducing the hydrogen concentration and where defect states in the energy gap generated due to oxygen vacancies are reduced by supplying a sufficient amount of oxygen by the first heat treatment and the second heat treatment enables the off-state current of the transistor 200 to be reduced. Specifically, the off-state current (per unit channel width (1 μm) in this embodiment) at room temperature (25° C.) is suppressed to 100 zA (1 zA (zeptoampere) is $1\times10^{-21}$ A) or less, preferably 10 zA or less.

Further, alkali metal such as lithium (Li) or sodium (Na) is an impurity for the metal oxide film 106a and the metal oxide film 114, and thus preferably contained as less as possible. The concentration of alkali metal in any of the metal oxide film 106a and the metal oxide film 114 is preferably $2\times10^{16}$ atoms/cm$^3$ or less, further preferably $1\times10^{15}$ atoms/cm$^3$ or less. Likewise, alkaline earth metal is also an impurity and thus preferably contained as less as possible.

Further, the metal oxide film is a conductor, a semiconductor, or an insulator, which depends on the amount of hydrogen or the number of oxygen vacancies. For example, the resistivity of the metal oxide film changes depending on the amount of hydrogen or the number of oxygen vacancies contained in the metal oxide film.

Heat treatment (for example, at 350° C.) on the structure in which insulating films from which oxygen is not eliminated by heat treatment are provided with the metal oxide film interposed therebetween decreases the resistivity of the metal oxide film to 10 Ω·cm or less, whereby the metal oxide film is turned into a conductor. On the other hand, heat treatment (for example, at 350° C.) on the structure in which insulating films from which oxygen is eliminated by heat treatment are provided with the metal oxide film interposed therebetween increases the resistivity of the metal oxide film to $1\times10^8$ Ω·cm or more, whereby the metal oxide film is turned into an insulator. Therefore, in order that the metal oxide film 114 is an insulator, the metal oxide film 114 may be formed to have a resistivity greater than or equal to $1\times10^8$ Ω·cm.

In order that the metal oxide film 106a is a semiconductor, it is necessary that the resistivity thereof falls within the range over the maximum resistivity of a conductor under the minimum resistivity of an insulator, and thus the metal oxide film 106a may be formed to have a resistivity greater than 10 Ω·cm and less than $1 \times 10^8$ Ω·cm.

Through the above-described process, the transistor 200 can be manufactured (see FIG. 3E).

The insulating film from which oxygen is eliminated by heat treatment is provided in contact with the metal oxide film (oxide semiconductor) including a channel formation region, and the metal oxide film for preventing out-diffusion of oxygen is provided in contact with the insulating film, whereby out-diffusion of oxygen of the insulating film can be suppressed and oxygen can be supplied efficiently to the metal oxide film including the channel formation region. Accordingly, oxygen vacancies in the metal oxide film including the channel formation region can be reduced, whereby generation of electrons which are carriers can be suppressed, so that a shift of the threshold voltage of the transistor in the negative direction can be suppressed.

Further, the metal oxide film for preventing out-diffusion of oxygen is sandwiched by the insulating films from which oxygen is eliminated by heat treatment, and the heat treatment is performed thereon, whereby oxygen vacancies in the metal oxide film for preventing out-diffusion of oxygen can be reduced, so that the metal oxide film can be turned into an insulator (shows insulating characteristics).

<Manufacturing Method of Application Example of Semiconductor Device>

The transistor 210 shown in FIG. 2A can be manufactured in a manner described below.

The gate electrode 102 is formed over the substrate 100, and then, the gate insulating film 120 is formed thereon. The insulating film 126, the metal oxide film 124, and the insulating film 122 are stacked in this order in the gate insulating film 120.

Materials and formation methods of the insulating films 126 and 122 are similar to those of the insulating films 112 and 116. Further, a material and a formation method of the metal oxide film 124 are similar to those of the metal oxide film 114.

Next, a first heat treatment is preferably performed thereon. Accordingly, the metal oxide film 124, which is sandwiched by the insulating films 126 and 122 from which oxygen is eliminated by heat treatment, is turned into an insulator (shows insulating characteristics). Then, a metal oxide film is formed over the gate insulating film 120 and is subjected to a photolithography process and an etching process to form the metal oxide film 106a.

Next, a conductive film is formed over the metal oxide film 106a and is subjected to a photolithography process and an etching process to form the source and drain electrodes 108a and 108b.

Next, the insulating film 118 is formed over the metal oxide film 106a and the source and drain electrodes 108a and 108b. A material and a formation method of the insulating film 118 are similar to those of the insulating film 112. Then, a second heat treatment may be performed thereon.

Through the above-described process, the transistor 210 can be manufactured.

The transistor 220 shown in FIG. 2B can be manufactured in a manner described below.

The gate electrode 102 is formed over the substrate 100, and then, the gate insulating film 120 is formed thereon.

Next, a metal oxide film is formed over the gate insulating film 120 and is subjected to a photolithography process and an etching process to form the metal oxide film 106a. After that, a first heat treatment is performed thereon. Accordingly, oxygen eliminated from the insulating film 126 is supplied to the metal oxide film 124, and oxygen eliminated from the insulating film 122 is supplied to the metal oxide films 124 and 106a. Further, hydrogen, water, and the like in the metal oxide film 106a can be reduced.

Next, the source and drain electrodes 108a and 108b and the passivation film 110 are formed over the metal oxide film 106a. Then, a second heat treatment is performed thereon.

Through the above, the transistor 220 can be manufactured.

Embodiment 1 can be implemented in appropriate combination with the structures described in the other embodiments.

(Embodiment 2)

In this embodiment, a transistor having a structure different from the structure described in Embodiment 1 is described.

Figure 4A:
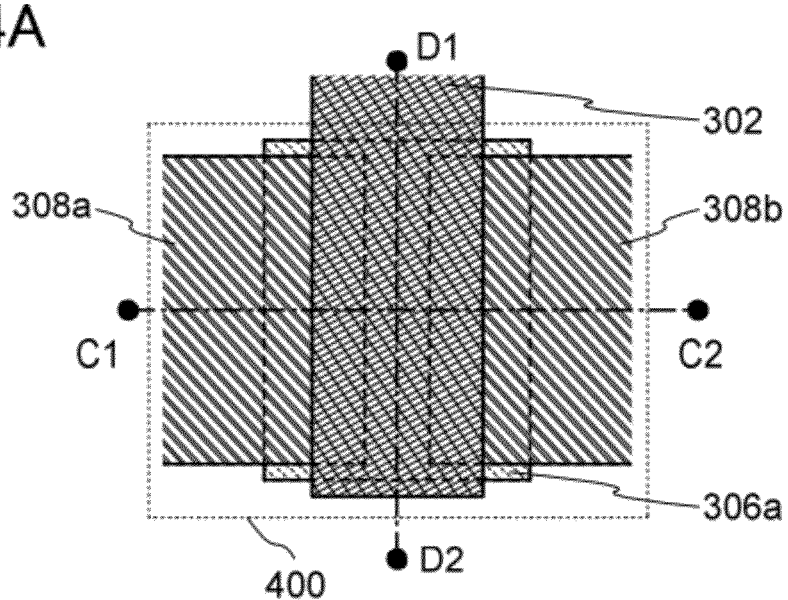
FIGS. 4A to 4C are a top view and cross-sectional views illustrating an example of a semiconductor device according to one embodiment of the present invention.
Figure 4B:
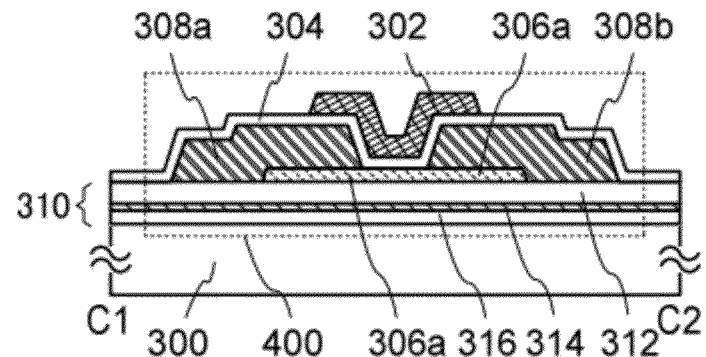
Figure 4C:
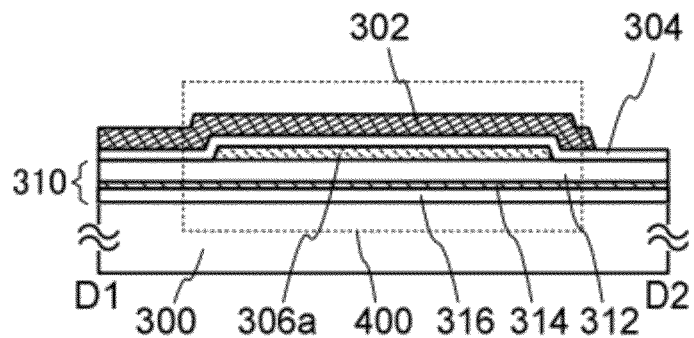

FIGS. 4A to 4C are a plan view and cross-sectional views of a transistor 400 as an example of a semiconductor device according to one embodiment of the present invention. FIG. 4A is a plan view, FIG. 4B is a cross-sectional view along A1-A2 of FIG. 4A, and FIG. 4C is a cross-sectional view along B1-B2 of FIG. 4A. In FIG. 4A, to avoid complexity, part of components of the transistor 400 (e.g., a gate insulating film 304) is omitted.

The transistor 400 shown in FIGS. 4A to 4C includes over a substrate 300, a base insulating film 310, a metal oxide film 306a over the base insulating film 310, a source and drain electrodes 308a and 308b which are in contact with the metal oxide film 306a, a gate insulating film 304 over the metal oxide film 306a and the source and drain electrodes 308a and 308b, and a gate electrode 302 which is provided over the gate insulating film 304 so as to overlap with the metal oxide film 306a.

A substrate similar to the substrate 100 can be used as the substrate 300. The metal oxide film 306a can be formed using a material and a method which are similar to those of the metal oxide film 106a. The source and drain electrodes 308a and 308b can be formed using a material and a method which are similar to those of the source and drain electrodes 108a and 108b. The gate insulating film 304 can be formed using a material and a method which are similar to those of the gate insulating film 104. The gate electrode 302 can be formed using a material and a method which are similar to those of the gate electrode 102.

The transistor 400 shown in FIGS. 4A to 4C is a top-gate transistor, and has a top-contact structure in which the source and drain electrodes 308a and 308b are in contact with a top surface of the metal oxide film 306a. Alternatively, a bottom-contact structure in which the source and drain electrodes 308a and 308b are in contact with a bottom surface of the metal oxide film 306a may be employed.

A region of the metal oxide film 306a which overlaps with the gate electrode 302 functions as a channel formation region.

The base insulating film 310 is provided over the substrate 300 so as to be in contact with the metal oxide film 306a. In the transistor 400 shown in FIGS. 4A to 4C, the base insulating film 310 includes an insulating film 312, a metal oxide film 314, and an insulating film 316. In this embodiment, insulating films from which oxygen is eliminated by heat treatment are used for the insulating films 312 and 316, and an insulating film from which oxygen is not eliminated by heat treatment is used for the gate insulating film 304.

The metal oxide film 306a is sandwiched by the gate insulating film 304 and the insulating film 312. Since the insulating film from which oxygen is eliminated by heat treatment is used as the insulating film 312, oxygen is eliminated from the insulating film 312 to be supplied to the metal oxide film 306a by heat treatment.

Further, in one embodiment of the present invention, the metal oxide film 314 for preventing out-diffusion of oxygen is provided in contact with the insulating film 312 from which oxygen is eliminated by heat treatment. Accordingly, out-diffusion of oxygen eliminated from the insulating film 312 by the heat treatment can be prevented.

Further, in one embodiment of the present invention, the metal oxide film 314 for preventing out-diffusion of oxygen is sandwiched by the insulating films 312 and 316 from which oxygen is eliminated by heat treatment. Accordingly, oxygen is eliminated also from the insulating film 316 by heat treatment to be supplied to the metal oxide film 314. Oxygen vacancies in the metal oxide film 314 are repaired by oxygen supplied from the insulating films 312 and 316, whereby the metal oxide film 314 is turned into an insulator (shows insulating characteristics). Accordingly, the metal oxide film 314, which is used as part of the base insulating film 310, does not affect the electrical characteristics of the transistor 400.

To improve the efficiency of supply of oxygen to the metal oxide film 306a, it is preferable that the thickness of the insulating film 312 in contact with the metal oxide film 306a be greater than that of the insulating film 316 in contact with the metal oxide film 314. Respective thicknesses of the insulating films 312 and 316 can be set in accordance with the thickness of the base insulating film 310.

The insulating film 312 can be formed using a material and a method which are similar to those of the insulating film 112. The metal oxide film 314 can be formed using a material and a method which are similar to those of the metal oxide film 114. Further, the insulating film 316 can be formed using a material and a method which are similar to those of the insulating film 116.

With the film from which oxygen is eliminated by heat treatment provided as the insulating film 312, oxygen is supplied from the insulating film 312 to the metal oxide film 306a, whereby interface states between the insulating film 312 and the metal oxide film 306a can be reduced. Accordingly, trapping of electric charges or the like, that can be generated owing to operation of the transistor 400, at the interface between the insulating film 312 and the metal oxide film 306a can be suppressed, which can make the transistor 400 a transistor with less deterioration of electrical characteristics.

The metal oxide film 314 is a metal oxide containing at least two elements selected from In, Ga, Sn, and Zn, like the metal oxide film 306a. An element contained in the metal oxide film 314 may be the same as or different from an element contained in the metal oxide film 306a. For example, an In—Ga—Zn—O-based material may be used for each of the metal oxide film 306a and the metal oxide film 314; alternatively, an In—Ga—Zn—O-based material may be used for the metal oxide film 306a, and an In—Ga—Zn—O—N-based material may be used for the metal oxide film 314.

<Application Example of Semiconductor Device>

Figure 5A:
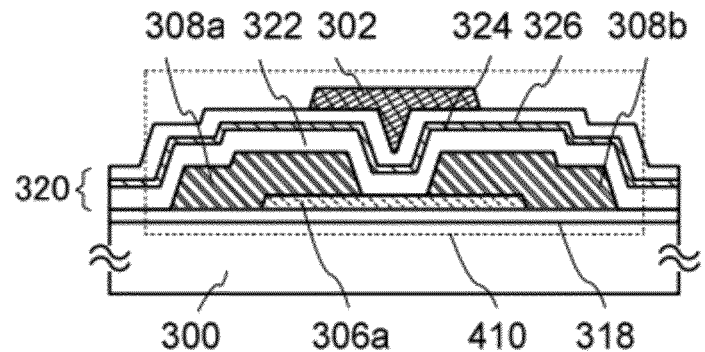
FIGS. 5A to 5C are views illustrating semiconductor devices according to embodiments of the present invention.
Figure 5B:
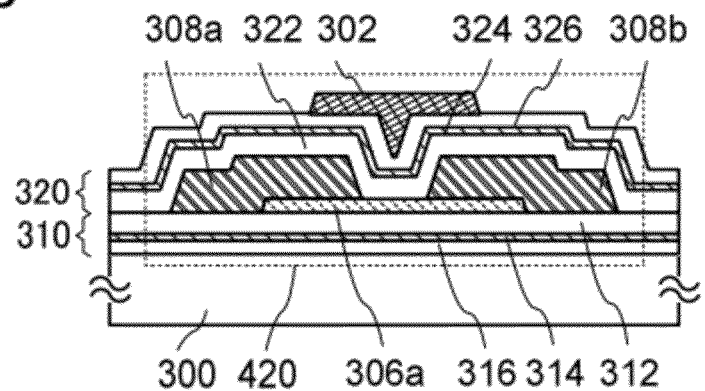
Figure 5C:
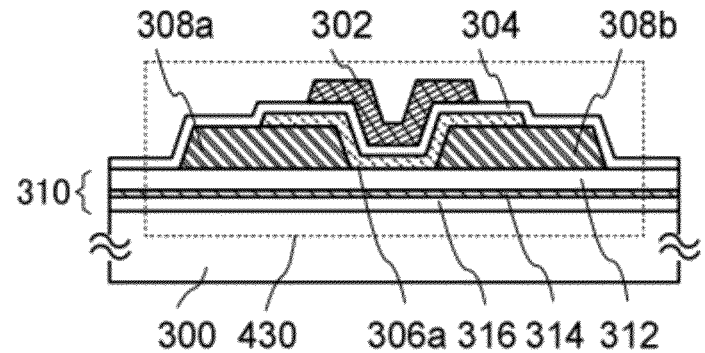

FIGS. 5A to 5C illustrate cross-sectional structures of transistors having different structures from the transistor 400.

A transistor 410 shown in FIG. 5A incudes over a substrate 300, an insulating film 318 as a base insulating film, a metal oxide film 306a over the insulating film 318, a source and drain electrodes 308a and 308b which are in contact with the metal oxide film 306a, a gate insulating film 320 over the metal oxide film 306a and the source and drain electrodes 308a and 308b, and a gate electrode 302 which is provided over the gate insulating film 320 so as to overlap with a channel formation region of the metal oxide film 306a.

The transistor 410 is different from the transistor 400 in that a metal oxide film for preventing out-diffusion of oxygen is provided in the gate insulating film 320. That is, the gate insulating film 320 has a three-layer structure including an insulating film 322, a metal oxide film 324, and an insulating film 326. Further, the insulating film 318 is provided as the base insulating film. In this embodiment, insulating films from which oxygen is eliminated by heat treatment are used for the insulating films 322, 326, and 318.

To improve the efficiency of supply of oxygen to the metal oxide film 306a, it is preferable that the thickness of the insulating film 322 in contact with the metal oxide film 306a be greater than that of the insulating film 326 in contact with the metal oxide film 324. Respective thicknesses of the insulating films 322 and 326 can be set in accordance with the thickness of the gate insulating film 320. Further, the metal oxide film 324 can prevent oxygen from passing therethrough with a thickness equal to or greater than 5 nm, and the thickness of the metal oxide film 324 can be set in accordance with the thickness of the gate insulating film 320.

A transistor 420 shown in FIG. 5B includes over a substrate 300, a base insulating film 310, a metal oxide film 306a over the base insulating film 310, a source and drain electrodes 308a and 308b which are in contact with the metal oxide film 306a, a gate insulating film 320 over the metal oxide film 306a and the source and drain electrodes 308a and 308b, and a gate electrode 302 which is provided over the gate insulating film 320 so as to overlap with a channel formation region of the metal oxide film 306a.

For the base insulating film 310 and the gate insulating film 320 of the transistor 420, the description of the transistor 400 and the transistor 410 can be referred to, and thus detailed description thereof is skipped.

The transistor 400, 410, 420 described hereinabove has a top-contact structure in which the source and drain electrodes 308a and 308b are in contact with a top surface of the metal oxide film 306a. Alternatively, a bottom-contact structure in which the source and drain electrodes 308a and 308b are in contact with a bottom surface of the metal oxide film 306a may be employed in a transistor in one embodiment of the present invention. An example of such a bottom-contact structure is illustrated in FIG. 5C.

A transistor 430 shown in FIG. 5C includes over a substrate 300, a base insulating film 310, a source and drain electrodes 308a and 308b over the base insulating film 310, a metal oxide film 306a which is provided in contact with the source and drain electrodes 308a and 308b, a gate insulating film 304 over the source and drain electrodes 308a and 308b and the metal oxide film 306a, and a gate electrode 302 which is provided so as to overlap with a channel formation region of the metal oxide film 306a.

As described above, a transistor according to one embodiment of the present invention can have various embodiments.

Furthermore, the structures, methods, and the like described in this embodiment can be combined as appropriate with any of the structures, methods, and the like described in the other embodiments.

(Embodiment 3)

In this embodiment, examples of a semiconductor device using the transistor described in the above embodiment and a manufacturing method thereof, and examples of a circuit configuration of the semiconductor device and operation thereof are described with reference to FIGS. 6A and 6B, FIG. 7, and FIGS. 8A to 8D. In this embodiment, an example of a semiconductor device whose structure corresponds to that of a so-called dynamic random access memory (DRAM)

is described. In each circuit diagram, in some cases, a transistor using an oxide semiconductor is marked with "OS".
<Cross-sectional Structure of Semiconductor Device>

First, an example of a cross-sectional structure of a semiconductor device is described with reference to FIG. 6A. The semiconductor device shown in FIG. 6A includes a transistor 400 and a capacitor 402.

Figure 6A:
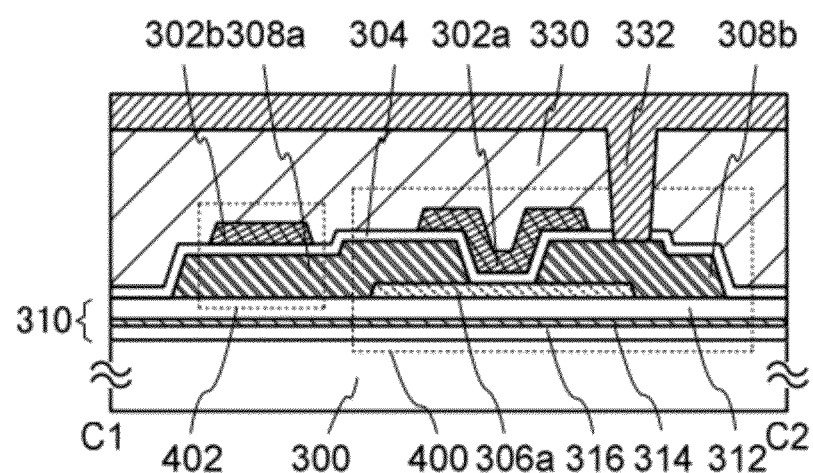
FIGS. 6A and 6B are a cross-sectional view and a circuit diagram illustrating an example of a semiconductor device according to one embodiment of the present invention.

A transistor according to one embodiment of the present invention is used as the transistor 400 in FIG. 6A. The transistor 400 includes over a substrate 300, a base insulating film 310, a metal oxide film 306a over the base insulating film 310, a source and drain electrodes 308a and 308b, a gate insulating film 304, and a gate electrode 302a. The base insulating film 310 includes an insulating film 312, a metal oxide film 314, and an insulating film 316.

The capacitor 402 in FIG. 6A includes the gate insulating film 304, the source or drain electrode 308a, and an electrode 302b. The source or drain electrode 308a functions as one electrode of the capacitor 402, and the electrode 302b functions as the other electrode of the capacitor 402.

An insulating film 330 is provided to cover the transistor 400 and the capacitor 402. Further, a wiring 332 is connected to the source or drain electrode 308b via an opening formed in the insulating film 330.
<Basic Circuit 1>

Next, a basic circuit configuration of the semiconductor device shown in FIG. 6A and its operation are described with reference to FIG. 6B. In a semiconductor device shown in FIG. 6B, a first wiring (1st Line) is electrically connected to one of the source and drain electrodes of the transistor 400, a second wiring (2nd Line) is electrically connected to a gate electrode of the transistor 400, and one electrode of the capacitor 402 is electrically connected to the other of the source and drain electrodes of the transistor 400. Further, a third wiring (3rd Line) is electrically connected to the other electrode of the capacitor 402.

A transistor using an oxide semiconductor is used as the transistor 400, for example. Such a transistor using an oxide semiconductor has a feature of a significantly small off-state current. Therefore, with the transistor 400 turned off, a potential supplied to the capacitor 402 can be retained for an extremely long time.

The semiconductor device shown in FIG. 6B utilizes its feature in that the potential supplied to the capacitor 402 can be retained, whereby writing, retaining, and reading of data can be performed in a manner described below.

Writing and retaining of data are described below. For simplicity, the potential of the third line is assumed to be fixed. First, the potential of the second wiring is set to a potential which allows the transistor 400 to be turned on to turn on the transistor 400. Consequently, the potential of the first wiring is supplied to one electrode of the capacitor 402. That is, predetermined electric charge is supplied to the capacitor 402 (data writing). After that, the potential of the second line is changed to a potential which allows the transistor 400 to be turned off to turn off the transistor 400, whereby the electric charge given to the capacitor 402 is retained (data retaining). The transistor 400 whose off-state current is extremely small as described above enables electric charge to be retained for a long time.

Next, reading of data is described. The potential of the second line is changed to the potential which allows the transistor 400 to be turned on while the predetermined potential (constant potential) is supplied to the first wiring, so that the potential of the first wiring varies depending on the amount of electric charge retained in the capacitor 402. Therefore, the retained data can be read by detecting the potential of the first wiring.

Next, rewriting of data is described. Data rewriting is performed in a manner similar to that of the writing and retaining of data. That is, the potential of the second wiring is set to the potential which allows the transistor 400 to be turned on to turn on the transistor 400. Accordingly, the potential of the first wiring (potential related to new data) is supplied to one electrode of the capacitor 402. After that, the potential of the second wiring is changed to the potential which allows the transistor 400 to be turned off to turn off the transistor 400, so that the electric charge related to new data is retained in the capacitor 402.

As described above, in the semiconductor device according to one embodiment of the present invention, data can be directly rewritten by writing the data. Accordingly, high-speed operation of the semiconductor device can be realized.

An n-channel transistor (n-type transistor) in which electrons are carriers is used in the above description, but it will be appreciated that a p-channel transistor in which holes are majority carriers can alternatively be used instead of the n-channel transistor.

Figure 6B:
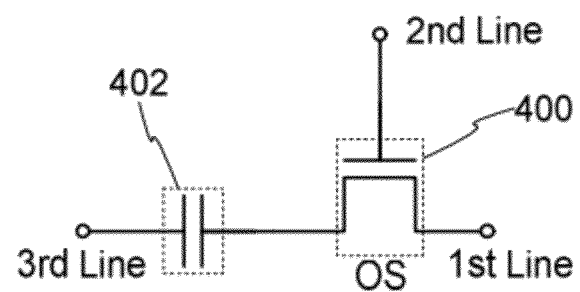
Figure 7:
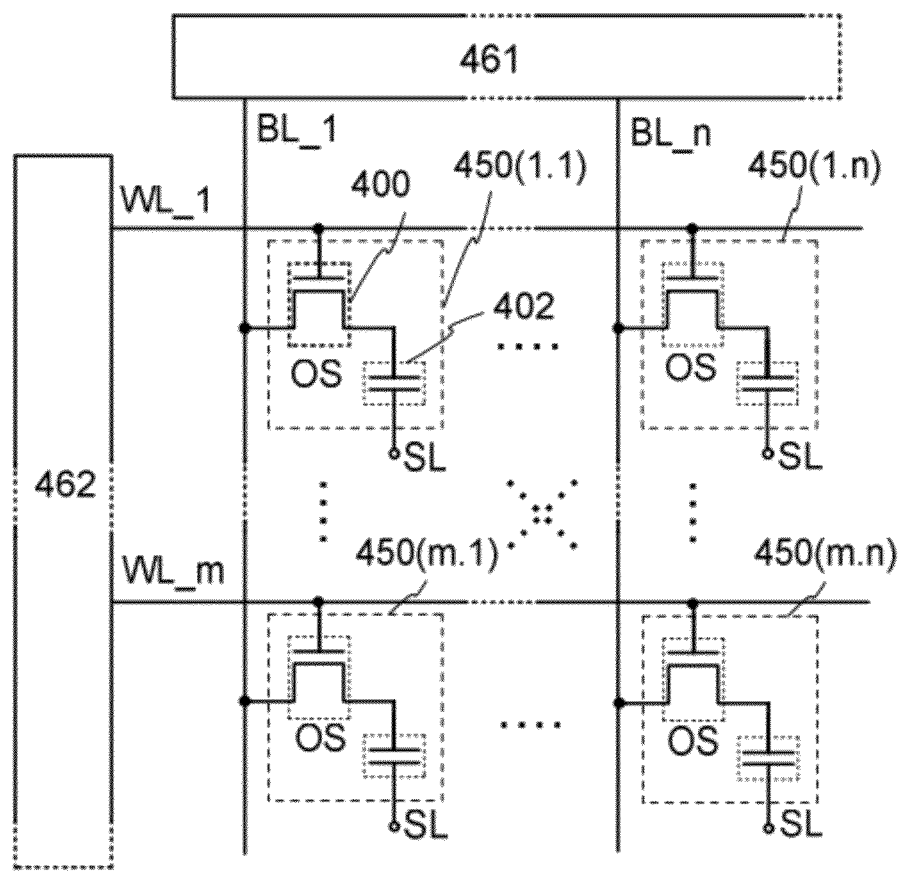
FIG. 7 is a circuit diagram of a semiconductor device according to one embodiment of the present invention.

FIG. 7 illustrates an example of a circuit diagram of a semiconductor device including m×n memory cells 450. The configuration of the memory cell 450 in FIG. 7 is similar to that in FIGS. 6A and 6B. In other words, the first wiring in FIG. 6B corresponds to a bit line BL in FIG. 7; the second wiring in FIG. 6B corresponds to a word line WL in FIG. 7; and the third wiring in FIG. 6B corresponds to a source line SL in FIG. 7 (see FIG. 7).

The semiconductor device shown in FIG. 7 includes n bit lines BL, m word lines WL, a memory cell array having the memory cells 450 arranged in a matrix of m (rows) (in the vertical direction)×n (columns) (in the horizontal direction), a first driver circuit 461 connected to the n bit lines BL, and a second driver circuit 462 connected to the m word lines WL.

The memory cell 450 includes a transistor 400 and a capacitor 402. A gate electrode of the transistor 400 is connected to the word line WL. Further, one of a source and drain electrodes of the transistor 400 is connected to the bit line BL, and the other of the source and drain electrodes of the transistor 400 is connected to one electrode of the capacitor 402. The other electrode of the capacitor 402 is connected to the source line SL and supplied with a predetermined potential. The transistor described in the above embodiment is used as the transistor 400.

The semiconductor device which is one embodiment of the present invention is a transistor in which a channel formation region is formed in an oxide semiconductor, and thus has a feature in that the off-state current is smaller than that of a transistor in which a channel formation region is formed in single crystal silicon. Accordingly, with the transistor applied to the semiconductor device shown in FIG. 7, which is regarded as a so-called DRAM, a memory whose interval between refresh periods is extremely long can be provided.
<Manufacturing Method of Semiconductor Device>

Next, a method for manufacturing the semiconductor device shown in FIGS. 6A and 6B is described with reference to FIGS. 8A to 8D.

Figure 8A:
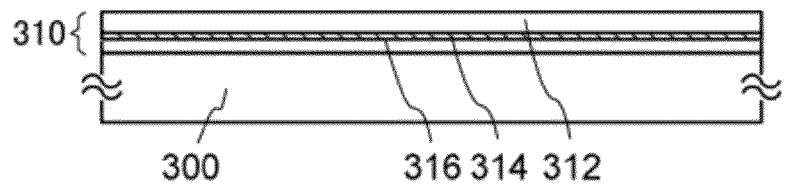
FIGS. 8A to 8D are views illustrating a manufacturing method of a semiconductor device, according to one embodiment of the present invention.

First, over the substrate 300, the insulating film 312, the metal oxide film 314, and the insulating film 316 are stacked in this order to form the base insulating film 310 (see FIG. 8A). A material similar to the substrate 100 can be used for the substrate 300, and thus detailed description thereof is skipped. For the insulating films 312 and 316, respectively, the description of the insulating films 112 and 116 can be referred to, and thus detailed description thereof is skipped.

Figure 8B:
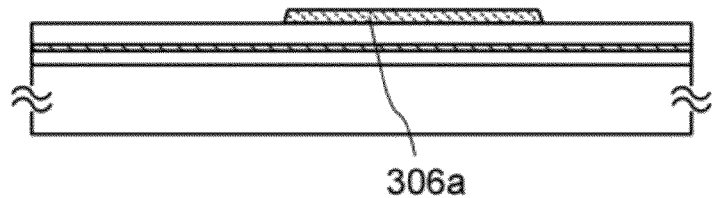
Figure 8C:
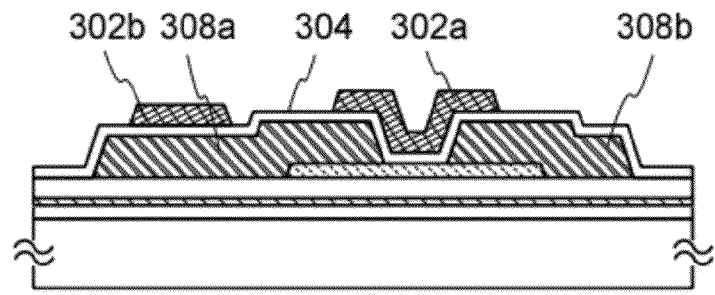

Next, the metal oxide film 306a is formed over the base insulating film 310 (see FIG. 8B). For the metal oxide film 306a, the description of the metal oxide film 106a can be referred to.

Next, the source and drain electrodes 308a and 308b are formed in contact with the metal oxide film 306a, and the gate insulating film 304 is formed over the source and drain electrodes 308a and 308b. Then, over the gate insulating film 304, the gate electrode 302a is formed in a region which overlaps with a channel formation region in the metal oxide film 306a, and the electrode 302b is formed in a region which overlaps with the source or drain electrode 308a (see FIG. 8C). For the source and drain electrodes 308a and 308b, the description of the source and drain electrodes 108a and 108b can be referred to.

Next, the insulating film 330 functioning as an interlayer insulating film is formed to cover the gate insulating film 304, the gate electrode 302a, and the electrode 302b. Then, an opening is formed in the insulating film 330 and the gate insulating film 304, and the wiring 332 is formed over the insulating film 330, whereby the source or drain electrode 308b is electrically connected to the wiring 332.

As the insulating film 330 functioning as an interlayer insulating film, an inorganic material (e.g., silicon oxide, silicon nitride, or silicon oxynitride), a photosensitive or non-photosensitive organic material (polyimide, acrylic, polyamide, polyimide amide, resist, or benzocyclobutene), a material called siloxane, which is composed of a skeleton formed by the bond of silicon (Si) and oxygen (O) and contains at least hydrogen or at least one of fluorine, an alkyl group, and aromatic hydrocarbon as a substituent, or a stack thereof can be used.

The wiring 332 is formed as follows: a conductive film is formed by a sputtering method, a plasma enhanced CVD method, or the like and is subjected to a photolithography process and an etching process. As a material of the conductive film, an element selected from aluminum, chromium, copper, tantalum, titanium, molybdenum, and tungsten, an alloy containing any of these elements as a component, or the like can be used. One or more materials selected from manganese, magnesium, zirconium, beryllium, neodymium, and scandium may be used as well. The details thereof are similar to those of the gate electrode 102 and the like.

Figure 8D:
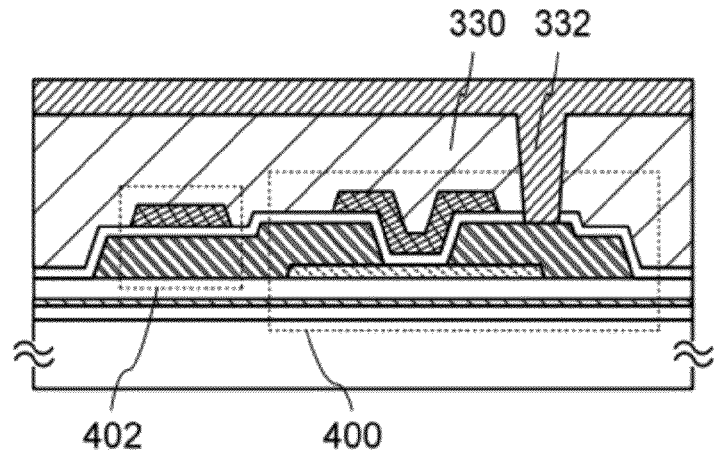

Through the above process, the semiconductor device including the transistor 400 and the capacitor 402 can be manufactured (see FIG. 8D).

The structures, methods, and the like described in this embodiment can be combined as appropriate with any of the structures, methods, and the like described in the other embodiments.

(Embodiment 4)

A semiconductor device according to one embodiment of the present invention can be applied to a variety of electronic devices (including game machines). Examples of the electronic devices are a television set (also called a television or a television receiver), a monitor of a computer or the like, a camera such as a digital camera or a digital video camera, a digital photo frame, a mobile phone handset (also called a mobile phone or a mobile phone device), a portable game machine, a portable data assistance, an audio reproducing device, a large-sized game machine such as a pachinko machine, and the like. Examples of such electronic appliances having the semiconductor device described in the above embodiment are described below.

Figure 9A:
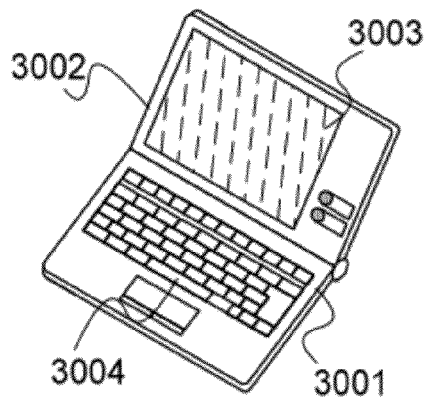
FIGS. 9A to 9F are views illustrating electronic devices.

FIG. 9A is a laptop personal computer which includes a main body 3001, a housing 3002, a display portion 3003, a keyboard 3004, and the like. Any semiconductor device described in Embodiments 1 and 2 can be applied to the display portion 3003. Further, the semiconductor device described in Embodiment 3 can be applied to a memory circuit in the housing 3002. Since a change of the electrical characteristics of any semiconductor device described in Embodiments 1 to 3 is suppressed, a laptop personal computer with high reliability can be provided.

Figure 9B:
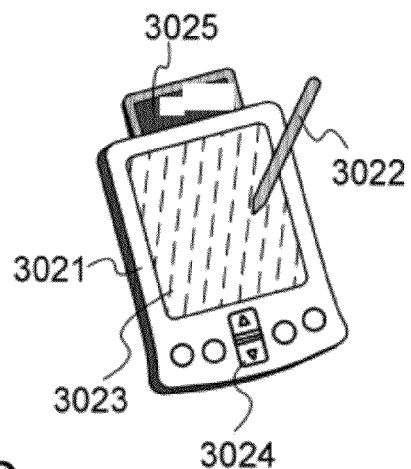

FIG. 9B is a portable data assistance (PDA) which includes a display portion 3023, an external interface 3025, an operation button 3024, and the like provided for a main body 3021. A stylus 3022 is equipped as an accessory for operation. Any semiconductor device described in Embodiments 1 and 2 can be applied to the display portion 3023. Further, the semiconductor device described in Embodiment 3 can be applied to a memory circuit in the main body 3021. Since a change of the electrical characteristics of any semiconductor device described in Embodiments 1 to 3 is suppressed, a portable data assistance with high reliability can be provided.

Figure 9C:
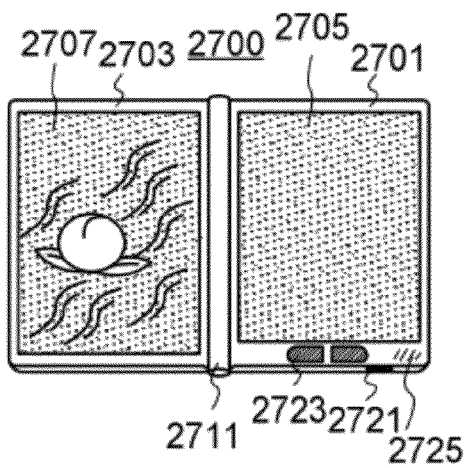

FIG. 9C illustrates an example of an e-book reader. For example, an e-book reader includes two housings, a housing 2701 and a housing 2703. The housing 2701 and the housing 2703 are combined with a hinge 2711 so that an e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image which constitutes one screen or different images. In the case where the display portion 2705 and the display portion 2707 display different images, for example, the display portion on the right side (the display portion 2705 in FIG. 9C) can display text and the display portion on the left side (the display portion 2707 in FIG. 9C) can display graphics. Any semiconductor device described in Embodiments 1 and 2 can be applied to the display portion 2705, 2707. Further, the semiconductor device described in Embodiment 3 can be applied to a memory circuit in the housing 2701, 2703. Since a change of the electrical characteristics of any semiconductor device described in Embodiments 1 to 3 is suppressed, an e-book reader with high reliability can be provided.

Further, FIG. 9C illustrates an example in which the housing 2701 is provided with an operation portion and the like. For example, the housing 2701 is provided with a power switch 2721, operation keys 2723, a speaker 2725, and the like. With the operation key 2723, pages can be turned. A keyboard, a pointing device, or the like may also be provided in the same surface of the housing as the display portion. Further, an external connection terminal (e.g., an earphone terminal, or a USB terminal), a recording medium insertion portion, and the like may be provided on the back surface or the side surface of the housing. Further, the e-book reader may be equipped with a function of an electronic dictionary.

The e-book reader may be configured to be able to transmit and receive data wirelessly. Through wireless communication, desired book data or the like can be purchased and downloaded from an electronic book server.

Figure 9D:
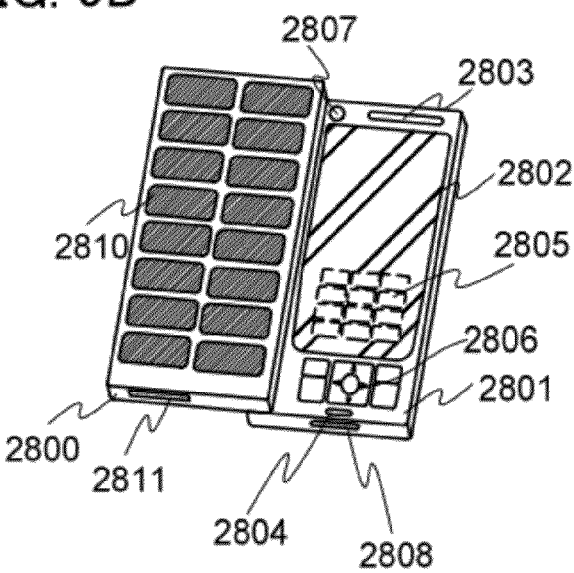

FIG. 9D illustrates a mobile phone which includes two housings, a housing 2800 and a housing 2801. The housing 2801 is provided with a display panel 2802, a speaker 2803, a microphone 2804, a pointing device 2806, a camera lens 2807, an external connection terminal 2808, and the like. The housing 2800 is provided with a solar cell 2810 for charging the mobile phone, an external memory slot 2811, and the like. Further, an antenna is incorporated in the housing 2801. Any semiconductor device described in Embodiments 1 and 2 can be applied to the display panel 2802. Further, the semiconductor device described in Embodiment 3 can be applied to a memory circuit in the housing 2800, 2801. Since a change of the electrical characteristics of any semiconductor device described in Embodiments 1 to 3 is suppressed, a mobile phone with high reliability can be provided.

The display panel 2802 is also provided with a touch panel in which a plurality of operation keys 2805 that is displayed as images is illustrated by dashed lines in FIG. 9D. Further, a boosting circuit by which a voltage output from the solar cell 2810 is increased to be sufficiently high for each circuit is also provided.

In the display panel 2802, the display direction is appropriately changed depending on a usage pattern. Further, the display device is provided with the camera lens 2807 on the same surface as the display panel 2802, and thus enables a videophone call. The speaker 2803 and the microphone 2804 can be used for videophone calls, recording and playing sound, and the like as well as voice calls. Further, the housings 2800 and 2801 in a state where they are developed as is in FIG. 9D can shift by sliding so that one is lapped over the other, whereby the size of the mobile phone can be reduced, which is suitable for carrying.

The external connection terminal 2808 can be connected to an AC adapter and various types of cables such as a USB cable, which enables charging and data communication with a personal computer or the like. Moreover, a large amount of data can be stored by inserting a storage medium thereof into the external memory slot 2811 and can be moved.

Further, in addition to the above functions, an infrared communication function, a television reception function, or the like may be equipped.

Figure 9E:
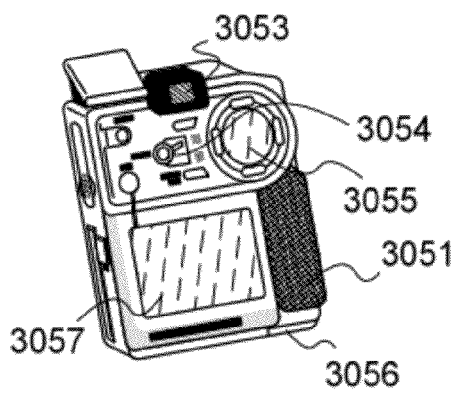

FIG. 9E illustrates a digital video camera which includes a main body 3051, a display portion A 3057, an eyepiece 3053, an operation switch 3054, a display portion B 3055, a battery 3056, and the like. Any semiconductor device described in Embodiments 1 and 2 can be applied to the display portion A 3057, the display portion B 3055. Further, the semiconductor device described in Embodiment 3 can be applied to a memory circuit in the main body 3051. Since a change of the electrical characteristics of any semiconductor device described in Embodiments 1 to 3 is suppressed, a digital video camera with high reliability can be provided.

Figure 9F:
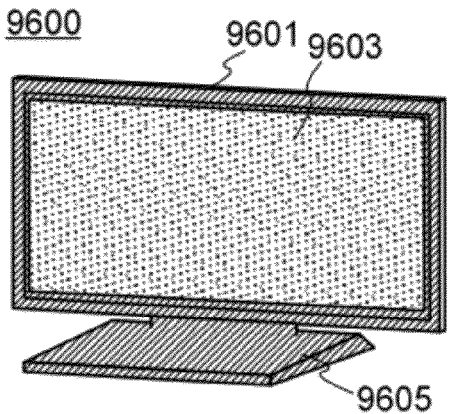

FIG. 9F illustrates an example of a television set. In a television set 9600, a display portion 9603 is incorporated in a housing 9601. The display portion 9603 can display images. In this embodiment, the housing 9601 is supported by a stand 9605. Any semiconductor device described in Embodiments 1 and 2 can be applied to the display portion 9603. Further, the semiconductor device described in Embodiment 3 can be applied to a memory circuit in the housing 9601. Since a change of the electrical characteristics of any semiconductor device described in Embodiments 1 to 3 is suppressed, a television set with high reliability can be provided.

The television set 9600 can be operated by an operation switch of the housing 9601 or a separate remote controller. Further, the remote controller may be provided with a display portion for displaying data output from the remote controller.

The television set 9600 is provided with a receiver, a modem, and the like. With the use of the receiver, general television broadcasting can be received. Moreover, the display device can be connected to a communication network with or without wires via the modem, whereby one-way (from sender to receiver) or two-way (between sender and receiver or between receivers) data communication can be performed.

Embodiment 4 can be implemented in appropriate combination with the structures described in the other embodiments.

EXAMPLE 1

In this example, MOS (metal oxide semiconductor) substrates were manufactured, and results of withstanding voltage measurement and CV (capacitance vs. voltage) measurement performed thereon are described using FIGS. 10A, 10B, 11A, and 11B, FIG. 12, FIGS. 13A, 13B, 14A, and 14B, and FIG. 15.

First, a method for manufacturing samples used in this example is described.

In Sample A, a 50-nm-thick silicon oxide (SiOx) film was formed as a first insulating film over a silicon (Si) substrate by a sputtering method. Next, a 10-nm-thick In—Ga—Zn—O—N-based metal oxide (IGZON) film was formed as a metal oxide film over the silicon oxide film by a sputtering method. Then, a 50-nm-thick silicon oxide film was formed as a second insulating film over the In—Ga—Zn—O—N-based metal oxide film by a sputtering method.

In Sample B, the metal oxide film in Sample A was replaced from the In—Ga—Zn—O—N-based metal oxide film to a 10-nm-thick In—Ga—Zn—O-based metal oxide (IGZO) film formed by a sputtering method. The other structure and the other manufacturing method of Sample B were the same as those of Sample A.

In Sample C, a 50-nm-thick silicon oxynitride (SiON) film was formed as a first insulating film over a silicon substrate by a plasma enhanced CVD method. Next, a 10-nm-thick In—Ga—Zn—O-based metal oxide film was formed over the silicon oxynitride film by a sputtering method. Then, a 50-nm-thick silicon oxynitride film was formed as a second insulating film over the In—Ga—Zn—O-based metal oxide film by a plasma enhanced CVD method.

In Sample D, the silicon oxide film (each of the first insulating film and the second insulating film) in Sample A was replaced with a 50-nm-thick silicon oxynitride film formed by a plasma enhanced CVD method. The other structure and the other manufacturing method of Sample D were the same as those of Sample A.

As Sample E, a 100-nm-thick silicon oxide film was formed over a silicon substrate by a sputtering method.

Next, heat treatment was performed on Samples A to E. The heat treatment was performed at 300° C. for one hour under a nitrogen atmosphere.

Next, in each of Samples A to E, a 400-nm-thick electrode (having an area of 0.785 mm$^2$) formed of an alloy of aluminum and titanium (AL—Ti) was formed over the second insulating film by a sputtering method.

Finally, heat treatment was performed on Samples A to E at 250° C. for one hour under a nitrogen atmosphere.

Structures of MOS substrates of Samples A to E thus obtained are shown in Table 1. Note that FIF, MOF, SIF and EL represent the first insulating film, the metal oxide film, the second insulating film and the electrode, respectively.

TABLE 1

| Sample | Substrate | FIF (nm) | MOF (nm) | SIF (nm) | EL (nm) |
|---|---|---|---|---|---|
| A | Si | SiOx (50) | IGZON (10) | SiOx (50) | Al—Ti |
| B |  | SiOx (50) | IGZO (10) | SiOx (50) | (400) |

TABLE 1-continued

| Sample | Substrate | FIF (nm) | MOF (nm) | SIF (nm) | EL (nm) |
|---|---|---|---|---|---|
| C | | SiON (50) | IGZO (10) | SiON (50) | |
| D | | SiON (50) | IGZON (10) | SiON (50) | |
| E | | SiOx (100) | — | | |

Next, current vs. voltage (I-V) characteristics of Samples A to E were measured. The measurement was performed at 13 points in each sample.

Figure 10A:
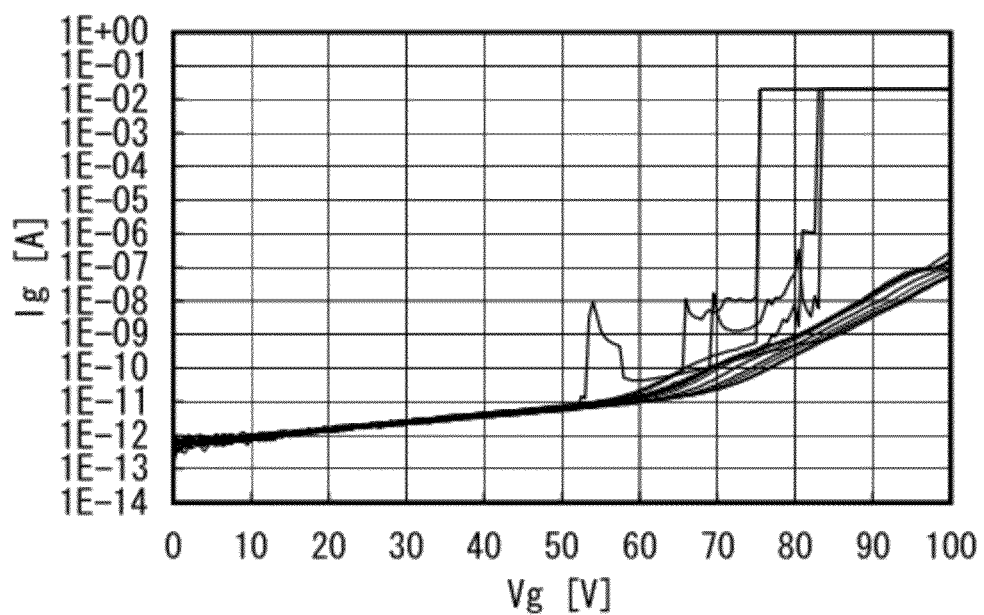
FIGS. 10A and 10B show results of withstanding voltage measurement.
Figure 10B:
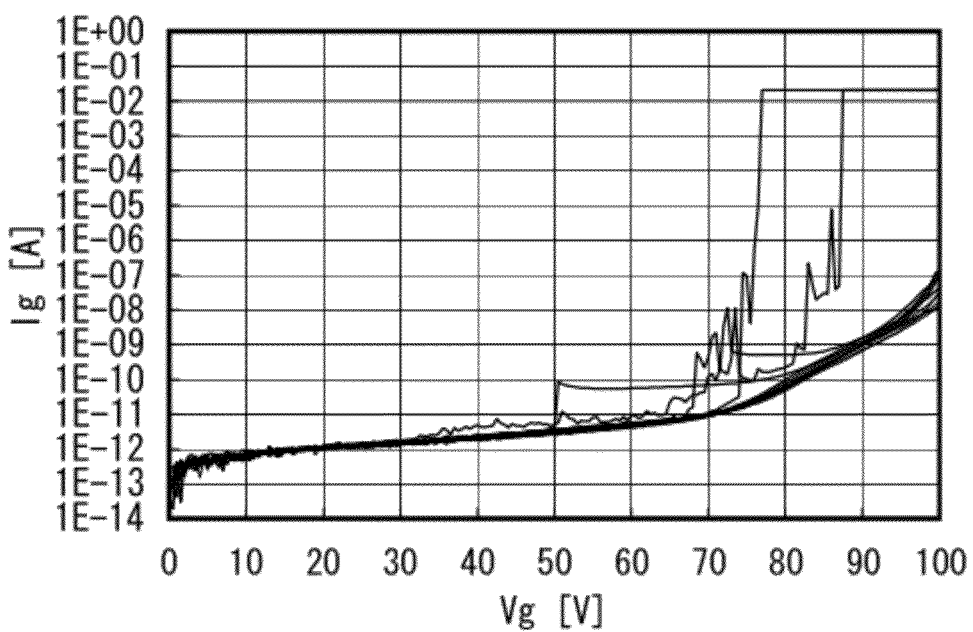
Figure 11A:
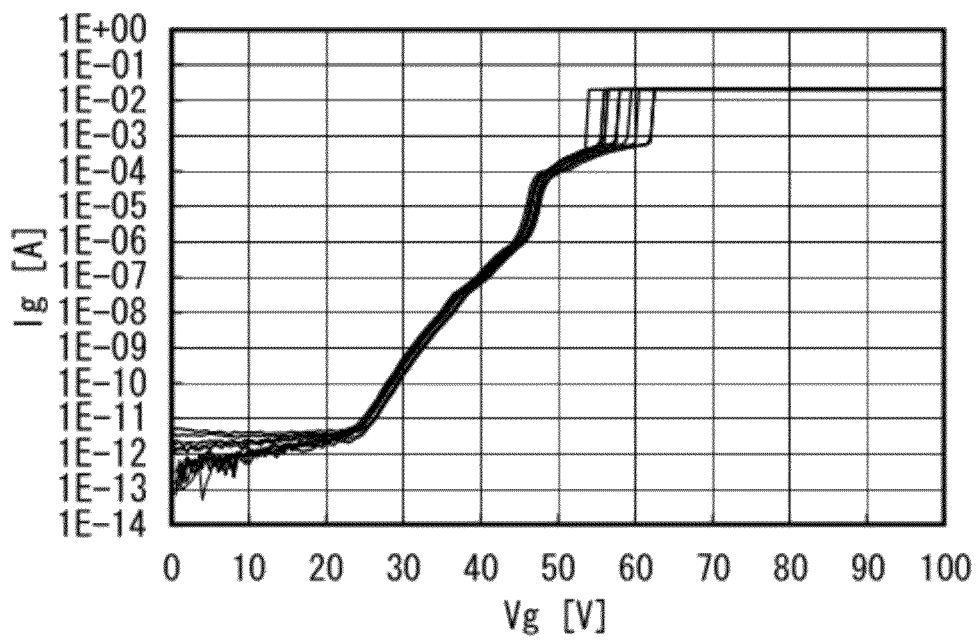
FIGS. 11A and 11B show results of withstanding voltage measurement.
Figure 11B:
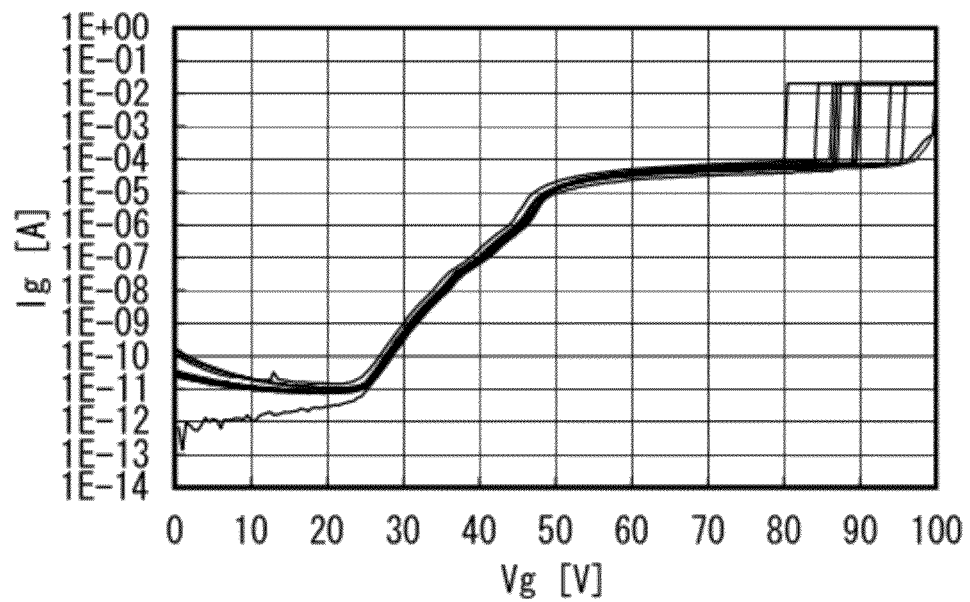
Figure 12:
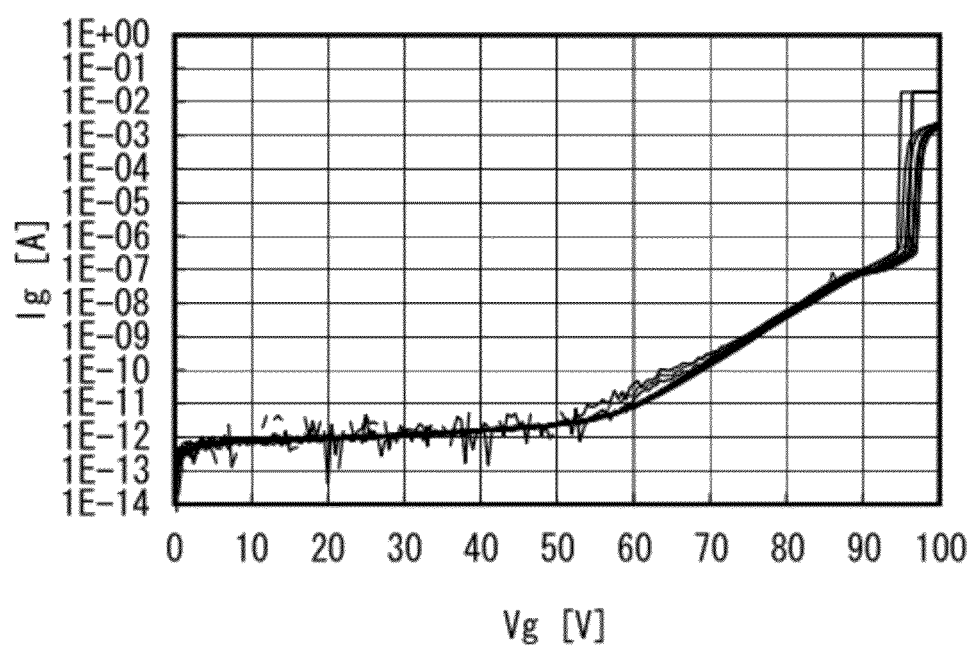
FIG. 12 shows results of withstanding voltage measurement.

Results of the withstanding voltage measurement are shown in FIGS. 10A, 10B, 11A, 11B, and 12. FIG. 10A shows results of Sample A; FIG. 10B shows results of Sample B; FIG. 11A shows results of Sample C; FIG. 11B shows results of Sample D; and FIG. 12 shows results of Sample E. In FIGS. 10A, 10B, 11A, 11B, and 12, the horizontal axis indicates voltage and the vertical axis indicates current.

It was found that Samples C and D shown in FIGS. 11A and 11B respectively exhibit fast rising of current and have low withstanding voltage. In contrast, it was found that Samples A and B shown in FIGS. 10A and 10B respectively exhibit slower rising of current and have higher withstanding voltage than Samples C and D. It was also found that Sample E shown in FIG. 12 has a withstanding voltage which is equivalent to those of samples A and B.

Next, CV (capacitance vs. voltage) measurement was performed on Samples A to E. The measurement was performed at 4 points in each sample.

Figure 13A:
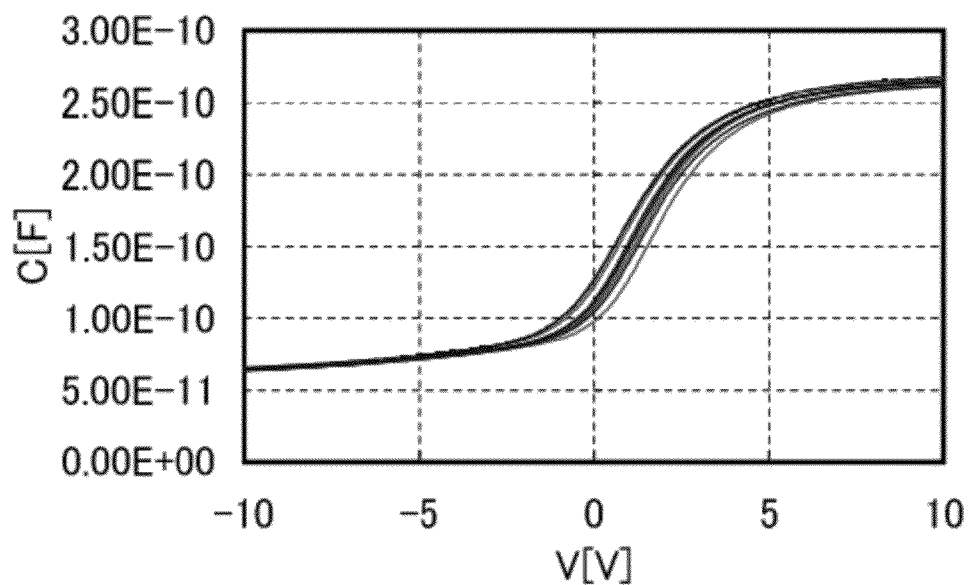
FIGS. 13A and 13B show results of CV (capacitance vs. voltage) measurement.
Figure 13B:
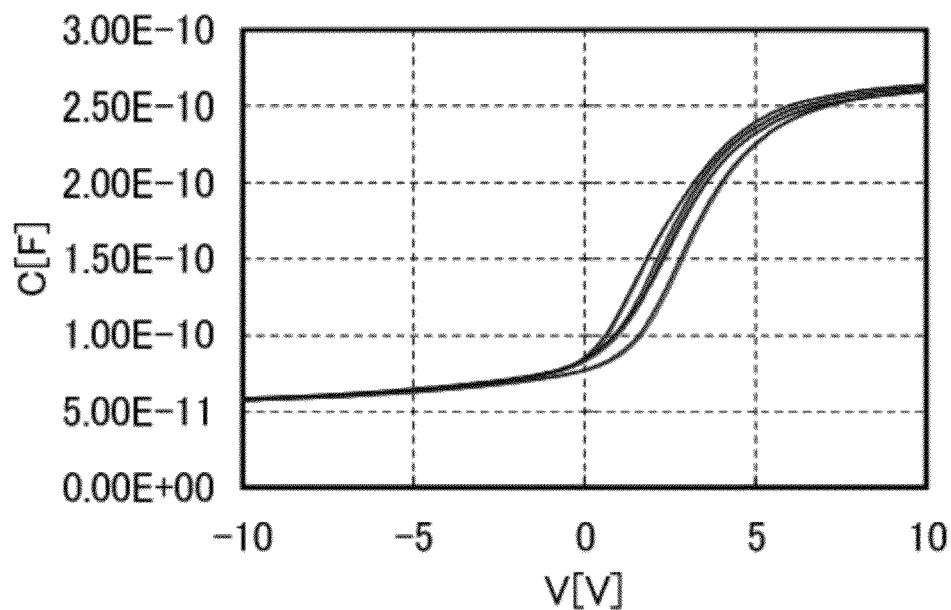
Figure 14A:
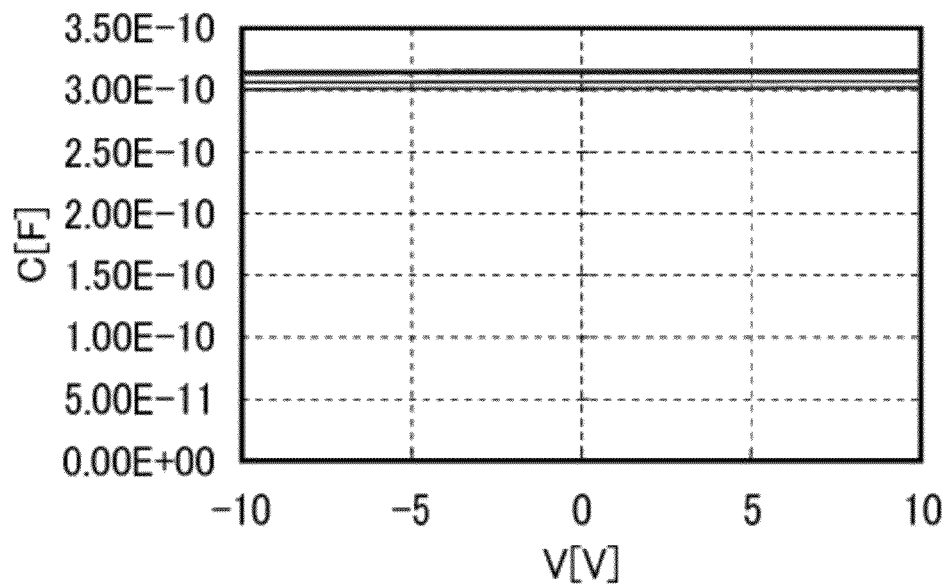
FIGS. 14A and 14B show results of CV (capacitance vs. voltage) measurement.
Figure 14B:
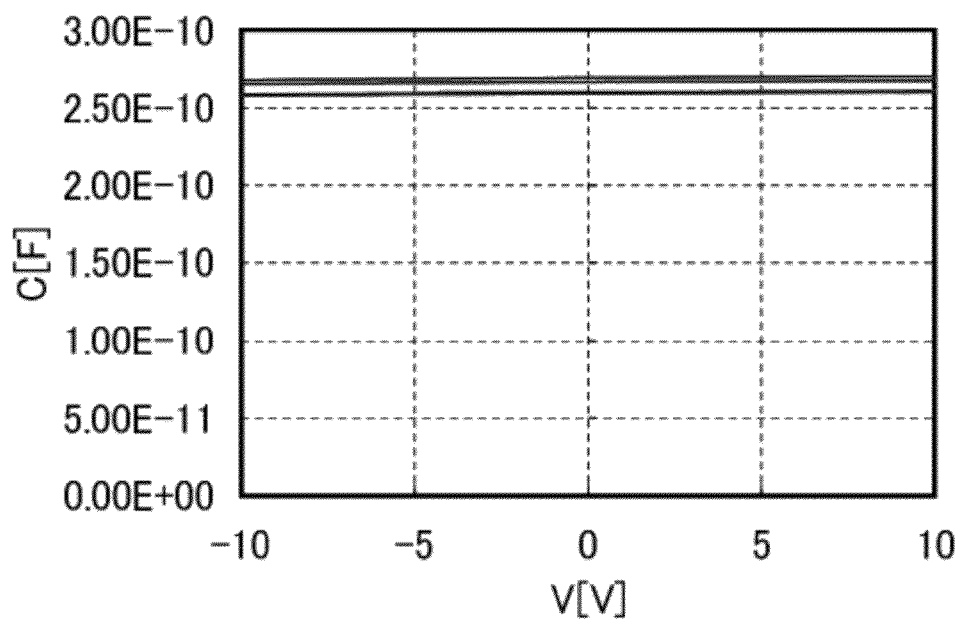
Figure 15:
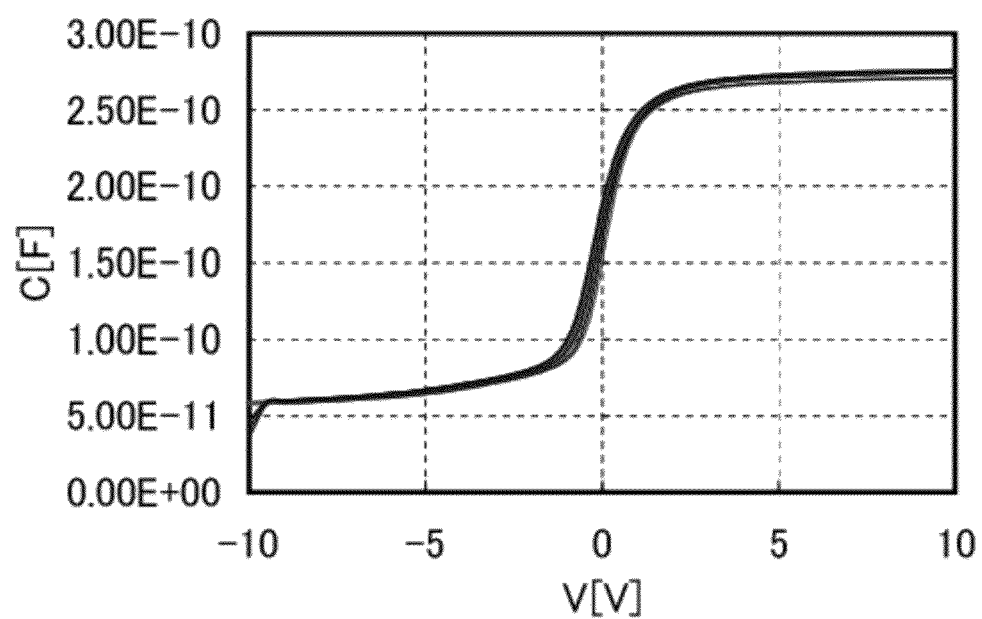
FIG. 15 shows results of CV (capacitance vs. voltage) measurement.

Results of the CV measurement are shown in FIGS. 13A, 13B, 14A, 14B, and 15. FIG. 13A shows results of Sample A; FIG. 13B shows results of Sample B; FIG. 14A shows results of Sample C; FIG. 14B shows results of Sample D; and FIG. 15 shows results of Sample E. In FIGS. 13A, 13B, 14A, 14B, and 15, the horizontal axis indicates voltage and the vertical axis indicates capacitance value.

No CV curve could be obtained in any of Samples C and D shown in FIGS. 14A and 14B respectively. This seems to be because the withstanding voltage of the insulating film in Samples C and D is not high enough to keep the capacitance as is seen from the results of FIGS. 11A and 11B. In contrast, Sample A shown in FIG. 13A, Sample B shown in FIG. 13B, and Sample E shown in FIG. 15 exhibited good CV Curves.

Further, it was found that the CV curves of Samples A and B shift in the positive direction as compared with the CV curve of Sample E. This is because more negative fixed charges exist in Samples A and B than Sample E, suggesting that provision of such an insulating film so as to be in contact with a metal oxide film including a channel formation region of a transistor enables the threshold voltage of the transistor to be shifted in the positive direction.

In Samples C and D, the silicon oxynitride films formed by a plasma enhanced CVD method were used as insulating films by which the metal oxide film was sandwiched. Oxygen is not eliminated by heat treatment from the silicon oxynitride film formed by a plasma enhanced CVD method. It seems that oxygen was not supplied from the insulating film to the metal oxide film, so that the metal oxide film was not able to be insulated. On the other hand, in Samples A and B, the silicon oxide films formed by a sputtering method were used as insulating films by which the metal oxide film was sandwiched. It seems that oxygen was eliminated by heat treatment from the silicon oxide film formed by a sputtering method and was supplied sufficiently to the metal oxide film, so that the metal oxide film could be insulated; this seems to be because the withstanding voltage of Samples A and B was improved.

The above results reveal that a metal oxide film being sandwiched by insulating films from which oxygen is eliminated by heat treatment functions as an insulating film.

EXAMPLE 2

Described in this example are results of TDS analysis of the amount of out-diffusion of oxygen passing through a metal oxide film from an insulating film from which oxygen is released by heat treatment, in a structure where the metal oxide film is formed over the insulating film.

First, Samples F to I used in this example are described.

In Sample F, a 100-nm-thick silicon oxide film was formed over a glass substrate by a sputtering method. Then, a 5-nm-thick In—Ga—Zn—O-based metal oxide film was formed over the silicon oxide film by a sputtering method.

In Sample G, a 100-nm-thick silicon oxide film was formed over a glass substrate by a sputtering method. Then, a 10-nm-thick In—Ga—Zn—O-based metal oxide film was formed over the silicon oxide film by a sputtering method.

In Sample H, a 100-nm-thick silicon oxide film was formed over a glass substrate by a sputtering method. Then, a 15-nm-thick In—Ga—Zn—O-based metal oxide film was formed over the silicon oxide film by a sputtering method.

In Sample I, a 100-nm-thick silicon oxide film was formed over a glass substrate by a sputtering method.

Next, TDS analysis was performed on Samples F to I. In this example, a thermal desorption spectrometer EMD-WA1000S/W, manufactured by ESCO Ltd. was used to detect values of the amount of eliminated oxygen.

Figure 16:
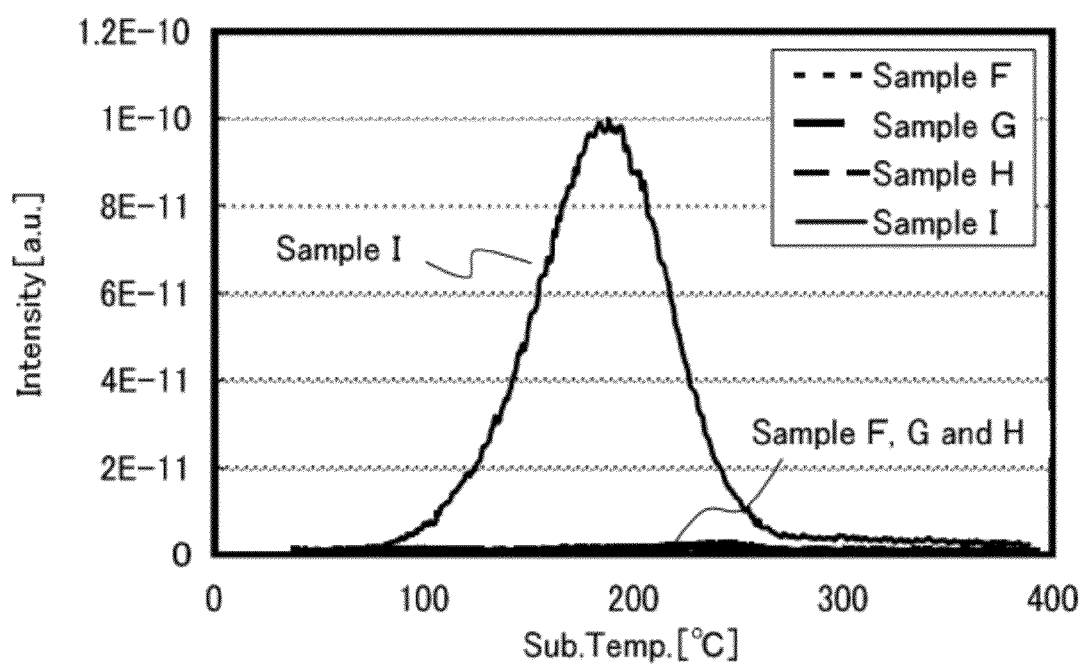
FIG. 16 shows results of TDS.

FIG. 16 shows results of the TDS analysis of Samples F to I.

As shown in FIG. 16, Sample I where only the silicon oxide film was formed had a peak at about 200° C. On the other hand, almost no peak was detected in Samples F to H where the metal oxide film was formed over the silicon oxide film.

The results shown in FIG. 16 revealed that out-diffusion of oxygen contained in a silicon oxide film can be prevented by forming a metal oxide film over the silicon oxide film. It was also indicated that the metal oxide film having a thickness of at least 5 nm prevents out-diffusion of oxygen contained in the silicon oxide film. Through the above results, it was proved that a metal oxide film can prevent oxygen from passing therethrough.

EXAMPLE 3

Figure 17:
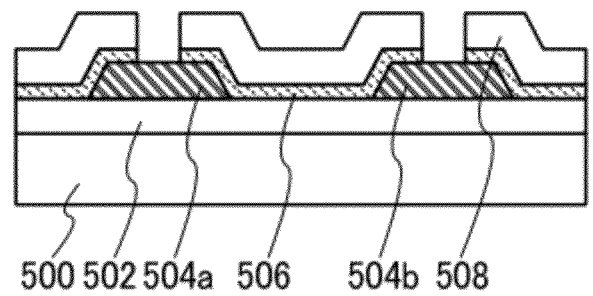
FIG. 17 is a view illustrating a structure of Sample according to Example 3.

In this example, results of measurement of resistivity of metal oxide films are described using FIG. 17.

First, samples used in this example are described using FIG. 17.

(Condition 1)

The case where insulating films from which oxygen is not eliminated by heat treatment were used as insulating films by which a metal oxide film 506 was sandwiched is referred to as Condition 1.

First, a 100-nm-thick silicon oxynitride film was formed as an insulating film 502 over a glass substrate 500 by a plasma enhanced CVD method.

Next, a 100-nm-thick tungsten film was formed thereover by a sputtering method. Then, the tungsten film was subjected to a photolithography process and an etching process to form electrodes 504a and 504b.

Next, an In—Ga—Zn—O-based metal oxide film was formed thereover as the metal oxide film 506 by a sputtering method. The conditions of forming the metal oxide film were the following: a target whose composition ratio is In:Ga:

Zn=1:1:1; Ar/O$_2$=30/15 sccm; a pressure of 0.4 Pa; a power of 0.5 kW; a substrate temperature of 200° C.; and a film thickness of 30 nm After that, heat treatment was performed on the metal oxide film 506 at 450° C. for one hour under a nitrogen atmosphere.

Next, a 100-nm-thick silicon oxynitride film was formed as an insulating film 508 thereover by a plasma enhanced CVD method.

Next, the insulating film 508 and the metal oxide film 506 were subjected to a photolithography process and an etching process to form openings reaching the electrode 504a, 504b.

Finally, heat treatment was performed on the sample at 350° C. for one hour under a nitrogen atmosphere.
(Condition 2)

The case where insulating films from which oxygen is eliminated by heat treatment were used as insulating films by which a metal oxide film 506 was sandwiched is referred to as Condition 2.

First, a 100-nm-thick silicon oxide film was formed as an insulating film 502 over a glass substrate 500 by a sputtering method.

Next, a 100-nm-thick tungsten film was formed thereover by a sputtering method. Then, the tungsten film was subjected to a photolithography process and an etching process to form electrodes 504a and 504b.

Next, an In—Ga—Zn—O-based metal oxide film was formed thereover as the metal oxide film 506 by a sputtering method. The conditions of forming the metal oxide film were the following: a target whose composition ratio is In:Ga:Zn=1:1:1; Ar/O$_2$=30/15 sccm; a pressure of 0.4 Pa; a power of 0.5 kW; a substrate temperature of 200° C.; and a film thickness of 30 nm After that, heat treatment was performed on the metal oxide film 506 at 450° C. for one hour under a nitrogen atmosphere.

Next, a 100-nm-thick silicon oxide film was formed as an insulating film 508 thereover by a sputtering method.

Next, the insulating film 508 and the metal oxide film 506 were subjected to a photolithography process and an etching process to form openings reaching the electrode 504a, 504b.

Finally, heat treatment was performed on the sample at 350° C. for one hour under a nitrogen atmosphere.
(Condition 3)

The case where an insulating film from which oxygen is eliminated by heat treatment was used as the insulating film 502, and an insulating film from which oxygen is not eliminated by heat treatment was used as the insulating film 508 by which a metal oxide film 506 was sandwiched is referred to as Condition 3.

First, a 100-nm-thick silicon oxide film was formed as the insulating film 502 over a glass substrate 500 by a sputtering method.

Next, a 100-nm-thick tungsten film was formed thereover by a sputtering method. Then, the tungsten film was subjected to a photolithography process and an etching process to form electrodes 504a and 504b.

Next, an In—Ga—Zn—O-based metal oxide film was formed thereover as the metal oxide film 506 by a sputtering method. The conditions of forming the metal oxide film were the following: a target whose composition ratio is In:Ga:Zn=1:1:1; Ar/O$_2$=30/15 sccm; a pressure of 0.4 Pa; a power of 0.5 kW; a substrate temperature of 200° C.; and a film thickness of 30 nm. After that, heat treatment was performed on the metal oxide film 506 at 450° C. for one hour under a nitrogen atmosphere.

Next, a 100-nm-thick silicon oxynitride film was formed as the insulating film 508 thereover by a plasma enhanced CVD method.

Next, the insulating film 508 and the metal oxide film 506 were subjected to a photolithography process and an etching process to form openings reaching the electrode 504a, 504b.

Finally, heat treatment was performed on the sample at 350° C. for one hour under a nitrogen atmosphere.
(Condition 4)

The case where an insulating film from which oxygen is not eliminated by heat treatment was used as the insulating film 502, and an insulating film from which oxygen is eliminated by heat treatment was used as an insulating film 508 by which a metal oxide film 506 was sandwiched is referred to as Condition 4.

First, a 100-nm-thick silicon oxynitride film was formed as the insulating film 502 over a glass substrate 500 by a plasma enhanced CVD method.

Next, a 100-nm-thick tungsten film was formed thereover by a sputtering method. Then, the tungsten film was subjected to a photolithography process and an etching process to form electrodes 504a and 504b.

Next, an In—Ga—Zn—O-based metal oxide film was formed thereover as the metal oxide film 506 by a sputtering method. The conditions of forming the metal oxide film were the following: a target whose composition ratio is In:Ga:Zn=1:1:1; Ar/O$_2$=30/15 sccm; a pressure of 0.4 Pa; a power of 0.5 kW; a substrate temperature of 200° C.; and a film thickness of 30 nm. After that, heat treatment was performed on the metal oxide film 506 at 450° C. for one hour under a nitrogen atmosphere.

Next, a 100-nm-thick silicon oxide film was formed as the insulating film 508 thereover by a sputtering method.

Next, the insulating film 508 and the metal oxide film 506 were subjected to a photolithography process and an etching process to form openings reaching the electrode 504a, 504b.

Finally, heat treatment was performed on the sample at 350° C. for one hour under a nitrogen atmosphere.

Next, the conductivity σ was measured at 4 points of each of respective samples in Conditions 1 to 4. The 4-point average resistivity ρ calculated from the measured conductivity σ is listed in Table 2.

TABLE 2

| | Resistivity ρ [Ω · cm] |
| --- | --- |
| Condition 1 | $1.4 \times 10^{-2}$ |
| Condition 2 | $7.4 \times 10^{9}$ |
| Condition 3 | $8.6 \times 10^{3}$ |
| Condition 4 | $8.5 \times 10^{6}$ |

As shown in Table 2, the resistivity p of the metal oxide film in Condition 1 was $1.4 \times 10^{-2}$ Ω·cm; the resistivity p of the metal oxide film in Condition 2 was $7.4 \times 10^{9}$ Ω·cm; the resistivity p of the metal oxide film in Condition 3 was $8.6 \times 10^{3}$ Ω·cm; and the resistivity p of the metal oxide film in Condition 4 was $8.5 \times 10^{6}$ Ω·cm.

According to the results of Condition 1, the resistance of the metal oxide film 506 once reduced by heat treatment after formation of the metal oxide film 506 is not changed to be kept to be low even by performing heat treatment after formation of the insulating film 508, whereby the metal oxide film 506 is turned into a conductor.

According to the results of Condition 2, the resistance of the metal oxide film 506 once reduced by heat treatment after formation of the metal oxide film 506 is increased by performing heat treatment after formation of the insulating film 508. This seems to be because oxygen vacancies generated in the metal oxide film are repaired by oxygen supplied from the insulating films 502 and 508. Consequently, the metal oxide film 506 is turned into an insulator (shows insulating characteristics).

According to the results of Conditions 3 and 4, the resistance of the metal oxide film 506 is changed to be higher than that in Condition 1 and lower than that in Condition 2 by heat treatment after formation of the insulating film 508, whereby the metal oxide film 506 remains a semiconductor.

Through the above results, it was revealed that the resistance of a metal oxide film can be adjusted by the kind of an insulating film which is in contact with the metal oxide film (or the amount of oxygen eliminated from the insulating film).

This application is based on Japanese Patent Application serial no. 2011-078111 filed with Japan Patent Office on Mar. 31, 2011, the entire contents of which are hereby incorporated by reference.

What is claimed is:

1. A semiconductor device comprising:
   a gate electrode;
   a gate insulating film;
   a first metal oxide film;
   a source electrode and a drain electrode which are in contact with the first metal oxide film; and
   a passivation film over the first metal oxide film, the source electrode and the drain electrode,
   wherein the passivation film comprises a first insulating film, a second metal oxide film, and a second insulating film,
   wherein the gate insulating film is sandwiched between the gate electrode and the first metal oxide film,
   wherein each of the first metal oxide film and the second metal oxide film contains at least two kinds of elements selected from In, Ga, Sn, and Zn,
   wherein the first metal oxide film is a semiconductor and the second metal oxide film is an insulator,
   wherein the second metal oxide film is sandwiched between the first insulating film and the second insulating film, and
   wherein the first insulating film is in contact with the first metal oxide film.

2. The semiconductor device according to claim 1, wherein a thickness of the first insulating film is greater than a thickness of the second insulating film.

3. The semiconductor device according to claim 1, wherein a thickness of the first metal oxide film is greater than a thickness of the second metal oxide film.

4. The semiconductor device according to claim 1, wherein a thickness of the second metal oxide film is greater than or equal to 5 nm and less than or equal to 15 nm.

5. The semiconductor device according to claim 1, wherein all elements contained in the first metal oxide film are the same as all elements contained in the second metal oxide film.

6. The semiconductor device according to claim 1,
   wherein an entire upper surface of the first insulating film is in contact with an entire lower surface of the second metal oxide film, and
   wherein an entire upper surface of the second metal oxide film is in contact with an entire lower surface of the second insulating film.

7. A semiconductor device comprising:
   a gate electrode;
   a gate insulating film;
   a first metal oxide film; and
   a source electrode and a drain electrode which are in contact with the first metal oxide film;
   wherein the gate insulating film comprises a first insulating film, a second metal oxide film, and a second insulating film,
   wherein each of the first metal oxide film and the second metal oxide film contains at least two kinds of elements selected from In, Ga, Sn, and Zn,
   wherein the first metal oxide film is a semiconductor and the second metal oxide film is an insulator,
   wherein the gate insulating film is sandwiched between the gate electrode and the first metal oxide film,
   wherein the second metal oxide film is sandwiched between the first insulating film and the second insulating film, and
   wherein the first insulating film is in contact with the first metal oxide film.

8. The semiconductor device according to claim 7, wherein a thickness of the first insulating film is greater than a thickness of the second insulating film.

9. The semiconductor device according to claim 7, wherein a thickness of the first metal oxide film is greater than a thickness of the second metal oxide film.

10. The semiconductor device according to claim 7, wherein a thickness of the second metal oxide film is greater than or equal to 5 nm and less than or equal to 15 nm.

11. The semiconductor device according to claim 7, wherein all elements contained in the first metal oxide film are the same as all elements contained in the second metal oxide film.

12. The semiconductor device according to claim 7,
    wherein an entire upper surface of the first insulating film is in contact with an entire lower surface of the second metal oxide film, and
    wherein an entire upper surface of the second metal oxide film is in contact with an entire lower surface of the second insulating film.

13. A semiconductor device comprising:
    a first metal oxide film;
    a source electrode and a drain electrode which are in contact with the first metal oxide film; and
    a film in contact with the first metal oxide film, the source electrode and the drain electrode,
    wherein the film comprises a first insulating film, a second metal oxide film and a second insulating film,
    wherein each of the first metal oxide film and the second metal oxide film contains at least two kinds of elements selected from In, Ga, Sn, and Zn,
    wherein the first metal oxide film is a semiconductor and the second metal oxide film is an insulator,
    wherein the second metal oxide film is sandwiched between the first metal oxide film and the second insulating film, and
    wherein the source electrode and the drain electrode are sandwiched between the first metal oxide film and the second metal oxide film.

14. The semiconductor device according to claim 13, further comprising a gate electrode,
    wherein the first metal oxide film is sandwiched between the gate electrode and the second metal oxide film.

15. The semiconductor device according to claim 13, wherein a thickness of the first metal oxide film is greater than a thickness of the second metal oxide film.

16. The semiconductor device according to claim 13, wherein a thickness of the second metal oxide film is greater than or equal to 5 nm and less than or equal to 15 nm.

17. The semiconductor device according to claim 13, wherein all elements contained in the first metal oxide film are the same as all elements contained in the second metal oxide film.

18. The semiconductor device according to claim 13,
wherein an entire upper surface of the first insulating film is in contact with an entire lower surface of the second metal oxide film, and
wherein an entire upper surface of the second metal oxide film is in contact with an entire lower surface of the second insulating film.

* * * * *